(12) United States Patent
Baek et al.

(10) Patent No.: US 10,665,606 B2
(45) Date of Patent: May 26, 2020

(54) THREE-DIMENSIONAL SEMICONDUCTOR MEMORY DEVICES

(71) Applicant: Samsung Electronics Co., Ltd., Suwon-si, Gyeonggi-do (KR)

(72) Inventors: Seokcheon Baek, Hwaseong-si (KR); Geunwon Lim, Yongin-si (KR); Hwan Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/222,059

(22) Filed: Dec. 17, 2018

(65) Prior Publication Data

US 2019/0319042 A1  Oct. 17, 2019

(30) Foreign Application Priority Data

Apr. 13, 2018  (KR) .................. 10-2018-0043244

(51) Int. Cl.
  *H01L 27/11565* (2017.01)
  *H01L 27/11582* (2017.01)
  (Continued)

(52) U.S. Cl.
  CPC .... *H01L 27/11582* (2013.01); *H01L 27/1052* (2013.01); *H01L 27/11565* (2013.01); *H01L 27/11573* (2013.01); *H01L 27/11578* (2013.01); *H01L 29/66666* (2013.01); *H01L 29/66833* (2013.01); *H01L 29/792* (2013.01)

(58) Field of Classification Search
  CPC ............... H01L 27/088; H01L 27/1052; H01L 27/11565; H01L 27/1157; H01L 27/11573; H01L 27/11578; H01L 27/11582; H01L 29/66666; H01L 29/66833; H01L 29/792; H01L 29/7926
  See application file for complete search history.

(56) References Cited

U.S. PATENT DOCUMENTS 8,405,142 B2  3/2013  Katsumata et al.
8,652,921 B2  2/2014  Lee et al.
(Continued)

FOREIGN PATENT DOCUMENTS

KR  10-0291150  7/2001
KR  10-1147526 B1  5/2012

*Primary Examiner* — Stephen W Smoot
(74) *Attorney, Agent, or Firm* — Harness, Dickey & Pierce, P.L.C.

(57) ABSTRACT

A three-dimensional semiconductor memory device includes a horizontal semiconductor layer on a peripheral logic structure, a cell electrode structure including cell gate electrodes vertically stacked on the horizontal semiconductor layer, ground selection gate electrodes provided between the cell electrode structure and the horizontal semiconductor layer and horizontally spaced apart from each other, each of the ground selection gate electrodes including first and second pads spaced apart from each other with the cell electrode structure interposed therebetween in a plan view, a first through-interconnection structure connecting the first pads of the ground selection gate electrodes to the peripheral logic structure, and a second through-interconnection structure connecting the second pads of the ground selection gate electrodes to the peripheral logic structure.

20 Claims, 22 Drawing Sheets

(51) Int. Cl.

| | | |
|---|---|---|
| *H01L 29/792* | (2006.01) | |
| *H01L 29/66* | (2006.01) | |
| *H01L 27/11573* | (2017.01) | |
| *H01L 27/11578* | (2017.01) | |
| *H01L 27/105* | (2006.01) | |

(56) References Cited

U.S. PATENT DOCUMENTS

| | | |
|---|---|---|
| 9,029,938 B2 | 5/2015 | Nakaki |
| 9,224,747 B2 | 12/2015 | Mizutani et al. |
| 9,515,084 B2 | 12/2016 | Oh et al. |
| 9,721,663 B1 | 8/2017 | Ogawa et al. |
| 9,754,673 B2 | 9/2017 | Park et al. |
| 2013/0009274 A1 | 1/2013 | Lee et al. |
| 2014/0061747 A1 | 3/2014 | Tanzawa et al. |
| 2015/0001613 A1 | 1/2015 | Yip et al. |
| 2015/0371925 A1 | 12/2015 | Thimmegowda et al. |
| 2016/0163386 A1 | 6/2016 | Hwang et al. |
| 2016/0163726 A1 | 6/2016 | Tanzawa |
| 2017/0200676 A1 | 7/2017 | Jeong et al. |
| 2018/0323207 A1* | 11/2018 | Shim ................. H01L 27/11582 |
| 2018/0374865 A1* | 12/2018 | Shimabukuro ... H01L 27/11582 |
| 2019/0237477 A1* | 8/2019 | Baek ................. H01L 27/11582 |
| 2019/0252386 A1* | 8/2019 | Lee ................... H01L 27/10805 |

\* cited by examiner

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2018-0043244, filed on Apr. 13, 2018, in the Korean Intellectual Property Office, the disclosure of which is hereby incorporated by reference in its entirety.

BACKGROUND

Embodiments of the inventive concepts relate to three-dimensional (3D) semiconductor memory devices and, more particularly, to 3D semiconductor memory devices with improved reliability and/or integration density.

Semiconductor devices have been more highly integrated to provide improved performance and/or lower manufacture costs. The integration density of semiconductor devices directly affects the costs of the semiconductor devices, thereby resulting in a demand of highly integrated semiconductor devices. The integration density of two-dimensional (2D) or planar semiconductor devices may be mainly determined by the area a unit memory cell occupies. Therefore, the integration density of the 2D or planar semiconductor devices may be greatly affected by a technique of forming fine patterns. However, since high-priced apparatuses are needed to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide three-dimensional (3D) semiconductor memory devices capable of improving reliability and/or integration density.

In an aspect, a 3D semiconductor memory device may include a horizontal semiconductor layer on a peripheral logic structure, a cell electrode structure including a plurality of cell gate electrodes vertically stacked on the horizontal semiconductor layer, a plurality of ground selection gate electrodes provided between the cell electrode structure and the horizontal semiconductor layer and horizontally spaced apart from each other, each of the plurality of ground selection gate electrodes including a first pad and a second pad which are spaced apart from each other with the cell electrode structure interposed therebetween when viewed in a plan view, a first through-interconnection structure connecting the first pads of the plurality of ground selection gate electrodes to the peripheral logic structure, and a second through-interconnection structure connecting the second pads of the plurality of ground selection gate electrodes to the peripheral logic structure.

In an aspect, a 3D semiconductor memory device may include a horizontal semiconductor layer including a cell array region and a common connection region, the horizontal semiconductor layer including an opening having first and second sidewalls intersecting each other in the common connection region, a cell electrode structure surrounding the opening when viewed in a plan view, the cell electrode structure including cell gate electrodes vertically stacked on the horizontal semiconductor layer, and a plurality of ground selection gate electrodes provided between the cell electrode structure and the horizontal semiconductor layer and horizontally spaced apart from each other. The plurality of ground selection gate electrodes may include first gate electrodes having first pads adjacent to the first sidewall of the opening, and second gate electrodes having first pads adjacent to the second sidewall of the opening.

In an aspect, a 3D semiconductor memory device may include a horizontal semiconductor layer including a first cell array region, a second cell array region, and a common connection region provided between the first and second cell array regions, the horizontal semiconductor layer including an opening having first and second sidewalls intersecting each other in the common connection region, a cell electrode structure surrounding the opening in a plan view and extending from the first cell array region to the second cell array region in a plan view, the cell electrode structure including cell gate electrodes vertically stacked on the horizontal semiconductor layer, and a plurality of ground selection gate electrodes provided between the cell electrode structure and the horizontal semiconductor layer and horizontally spaced apart from each other. Each of the plurality of ground selection gate electrodes may include a first pad and a second pad, which are spaced apart from each other with a portion of the cell electrode structure interposed therebetween when viewed in a plan view. The plurality of ground selection gate electrodes may include first gate electrodes of which the first pads are disposed adjacent to the first sidewall of the opening, and second gate electrodes of which the first pads are disposed adjacent to the second sidewall of the opening.

BRIEF DESCRIPTION OF THE DRAWINGS

The inventive concepts will become more apparent in view of the attached drawings and accompanying detailed description.

DETAILED DESCRIPTION OF THE EMBODIMENTS

Embodiments of the inventive concepts will be described hereinafter in detail with reference to the accompanying drawings.

Figure 1:
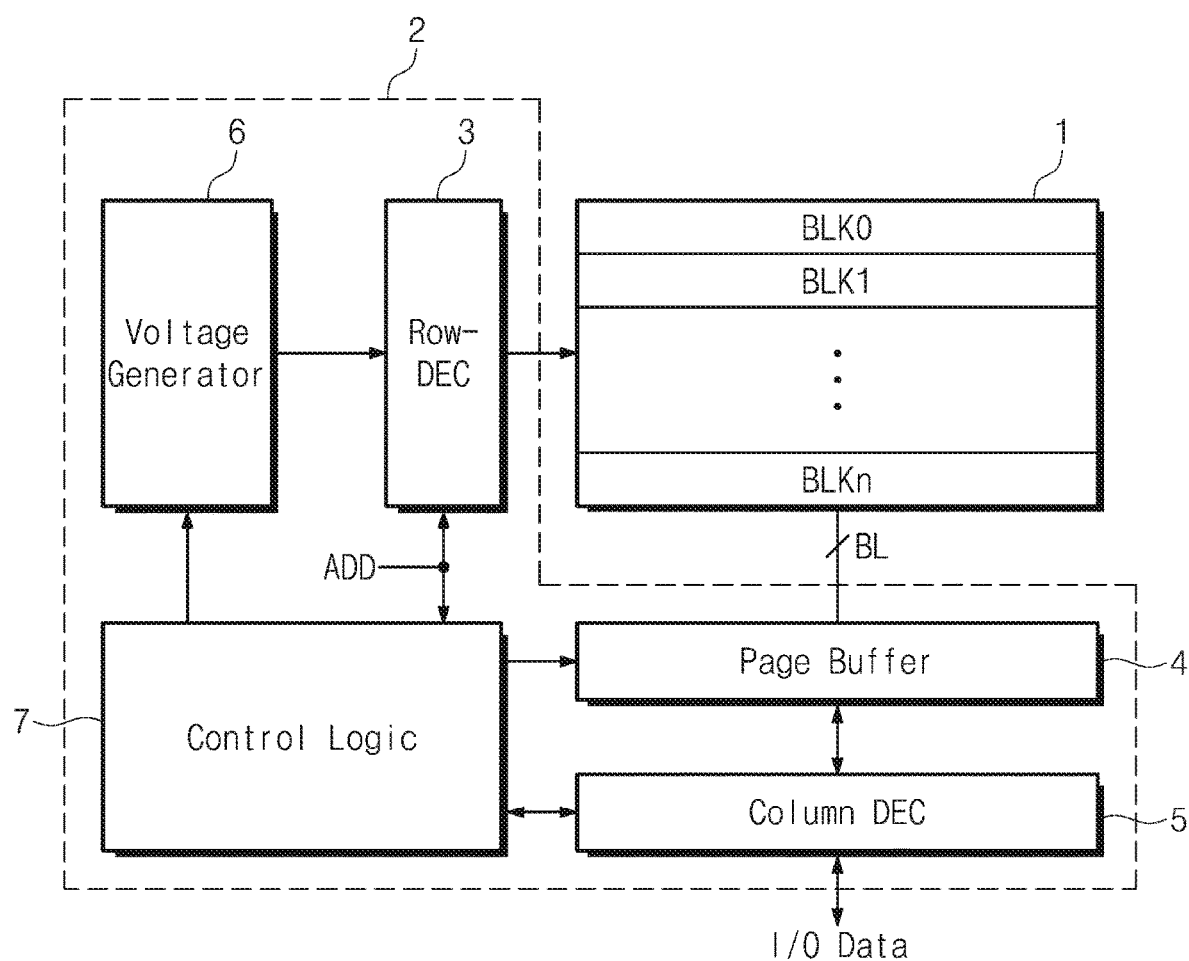
FIG. 1 is a schematic block diagram illustrating a 3D semiconductor memory device according to some embodiments of the inventive concepts.

FIG. 1 is a schematic block diagram illustrating a 3D semiconductor memory device according to some embodiments of the inventive concepts.

Referring to FIG. 1, a three-dimensional (3D) semiconductor memory device may include a memory cell array 1 and/or a peripheral circuit 2 for controlling the memory cell array 1. The peripheral circuit 2 may include a row decoder 3, a page buffer 4, a column decoder 5, a voltage generator 6, and/or a control logic circuit 7.

The memory cell array 1 may include a plurality of memory blocks BLK0 to BLKn, and each of the memory blocks BLK0 to BLKn may include a plurality of memory cells three-dimensionally arranged. In some embodiments, the memory blocks BLK0 to BLKn may include a plurality of NAND-type cell strings. The memory blocks BLK0 to BLKn may be connected to the row decoder 3 through word lines and/or selection lines.

The row decoder 3 may decode an inputted address signal ADD to select one among the memory blocks BLK0 to BLKn and to select one among the word lines of the selected memory block. The page buffer 4 may be connected to the memory cell array 1 through bit lines to read data stored in the memory cells. The column decoder 5 may decode an inputted address signal to select one among the bit lines. The column decoder 5 may provide a data transmission path between the page buffer 4 and an external device (e.g., a memory controller). The voltage generator 6 may be controlled by the control logic circuit 7 to generate voltages (e.g., a program voltage, a read voltage, and an erase voltage) necessary for internal operations of the memory cell array 1.

Figure 2:
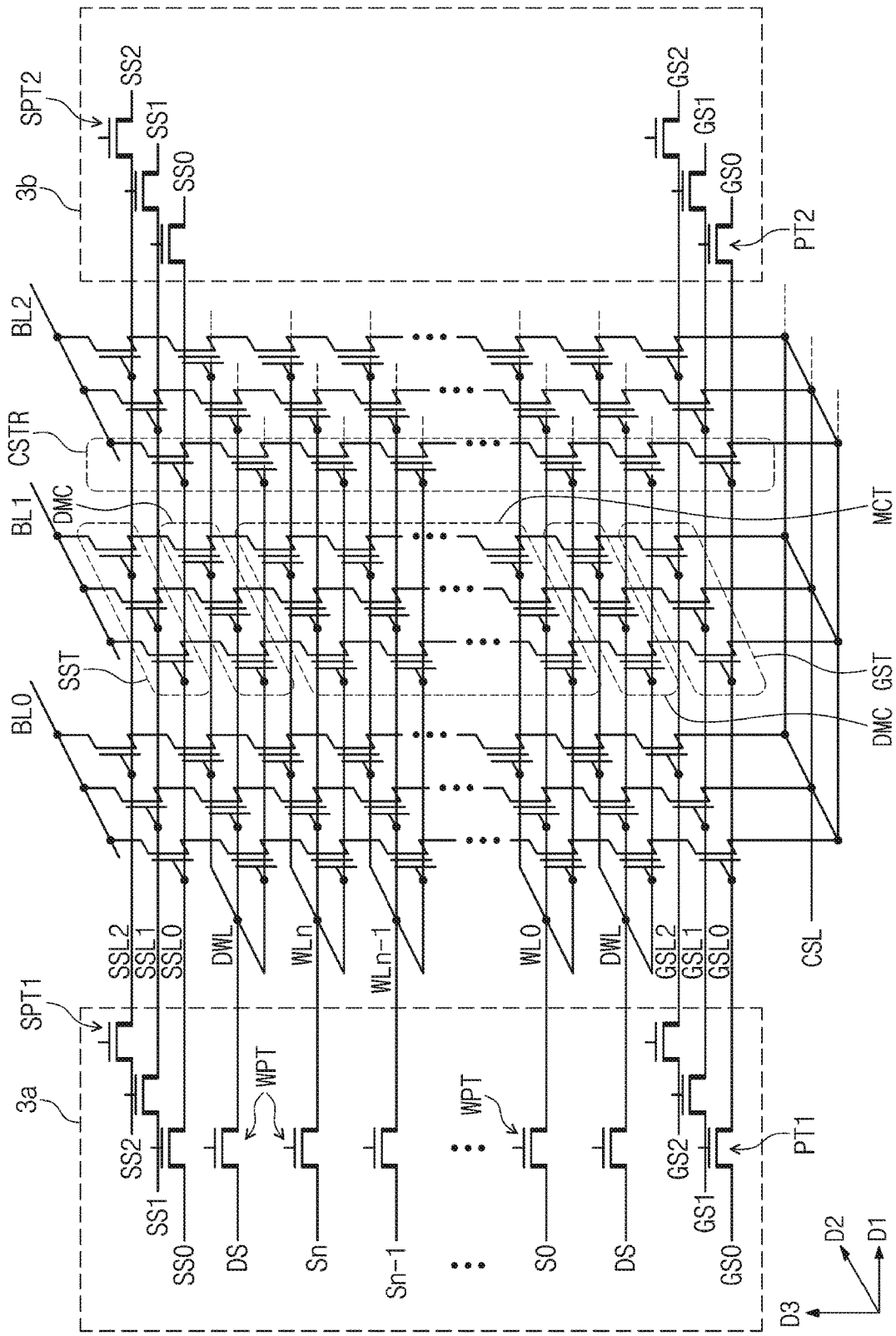
FIG. 2 is a circuit diagram illustrating a cell array and a row decoder of a 3D semiconductor memory device according to some embodiments of the inventive concepts.

FIG. 2 is a circuit diagram illustrating a cell array 1 and a row decoder 3a and 3b of a 3D semiconductor memory device according to some embodiments of the inventive concepts.

Referring to FIG. 2, in the 3D semiconductor memory device according to some embodiments of the inventive concepts, each of the memory blocks BLK0 to BLKn (see FIG. 1) may include a common source line CSL, a plurality of bit lines BL0 to BL2, and/or a plurality of cell strings CSTR connected between the common source line CSL and the bit lines BL0 to BL2.

The cell strings CSTR may be disposed on a plane defined by first and second directions D1 and D2 and may extend in a third direction D3. The bit lines BL0 to BL2 may be spaced apart from each other in the first direction D1 and may extend in the second direction D2.

A plurality of the cell strings CSTR may be connected in parallel to each of the bit lines BL0 to BL2. The cell strings CSTR may be connected in common to the common source line CSL. In other words, a plurality of the cell strings CSTR may be disposed between one common source line CSL and a plurality of the bit lines BL0 to BL2. The common source line CSL may be provided in plurality, and the plurality of common source lines CSL may be two-dimensionally arranged. In some embodiments, the same voltage may be applied to the plurality of common source lines CSL. In some embodiments, the common source lines CSL may be electrically controlled independently of each other.

In some embodiments, each of the cell strings CSTR may include a string selection transistor SST, memory cell transistors MCT connected in series to each other, and/or a ground selection transistor GST. Each of the memory cell transistors MCT may include a data storage element. In some embodiments, in each of the cell strings CSTR, the string selection transistor SST may be connected to one of the bit lines BL0 to BL2, and the ground selection transistor GST may be connected to the common source line CSL. The memory cell transistors MCT may be connected in series between the string selection transistor SST and the ground selection transistor GST. In addition, each of the cell strings CSTR may further include dummy cell transistors DMC which are connected between the string selection transistor SST and an uppermost one of the memory cell transistors MCT and between the ground selection transistor GST and a lowermost one of the memory cell transistors MCT, respectively.

In some embodiments, the string selection transistor SST may be controlled by one of string selection lines SSL0 to SSL2, the memory cell transistors MCT may be controlled by a plurality of word lines WL0 to WLn, and the dummy cell transistors DMC may be controlled by dummy word lines DWL. In addition, the ground selection transistor GST may be controlled by one of ground selection lines GSL0 to GSL2. The common source line CSL may be connected in common to sources of the ground selection transistors GST.

Gate electrodes of the memory cell transistors MCT (or the dummy cell transistors DWC) disposed at substantially the same level from the common source line CSL may be connected in common to one of the word lines WL0 to WLn and DWL so as to be in an equipotential state. The ground selection lines GSL0 to GSL2 and the string selection lines SSL0 to SSL2 may extend in the first direction D1 and may be spaced apart from each other in the second direction D2. The ground selection lines GSL0 to GSL2 disposed at substantially the same level from the common source line CSL may be electrically isolated from each other, and the string selection lines SSL0 to SSL2 disposed at substantially the same level from the common source line CSL may be electrically isolated from each other.

A row decoder 3a and 3b may include a plurality of pass transistors SPT1, SPT2, WPT, PT1 and PT2 connected to the selection lines SSL0 to SSL2 and GSL0 to GSL2 and the word lines WL0 to WLn and DWL, respectively. The pass transistors SPT1, SPT2, WPT, PT1 and PT2 may provide driving signals GS0 to GS2, SS0 to SS2, DS and S0 to Sn to the selection lines SSL0 to SSL2 and GSL0 to GSL2 and the word lines WL0 to WLn and DWL of a selected memory block (one of BLK0 to BLKn of FIG. 1). In some embodiments, a program voltage, a read voltage, a pass voltage or a verifying voltage may be provided to the word lines WL0 to WLn, and a ground voltage, a power voltage or a threshold voltage may be provided to the selection lines SSL0 to SSL2 and GSL0 to GSL2.

In some embodiments, a first ground selection pass transistor PT1 may be connected to a first end of each of the ground selection lines GSL0 to GSL2, and a second ground selection pass transistor PT2 may be connected to a second end of each of the ground selection lines GSL0 to GSL2. Each of the ground selection lines GSL0 to GSL2 may be driven in both directions by the first and second ground selection pass transistors PT1 and PT2. Thus, loads of each of the ground selection lines GSL0 to GSL2 which are applied to the first and second ground selection pass transistors PT1 and PT2 may be reduced. For example, effective resistances and coupling capacities of the ground selection lines GSL0 to GSL2 driven by the first and second ground selection pass transistors PT1 and PT2 may be reduced to reduce a time constant ($\tau$=RC). Thus, operating speeds of the ground selection transistors may be improved. Like the ground selection lines GSL0 to GSL2, each of the string selection lines SSL0 to SSL2 may be driven in both directions by string selection pass transistors SPT1 and SPT2.

Figure 3:
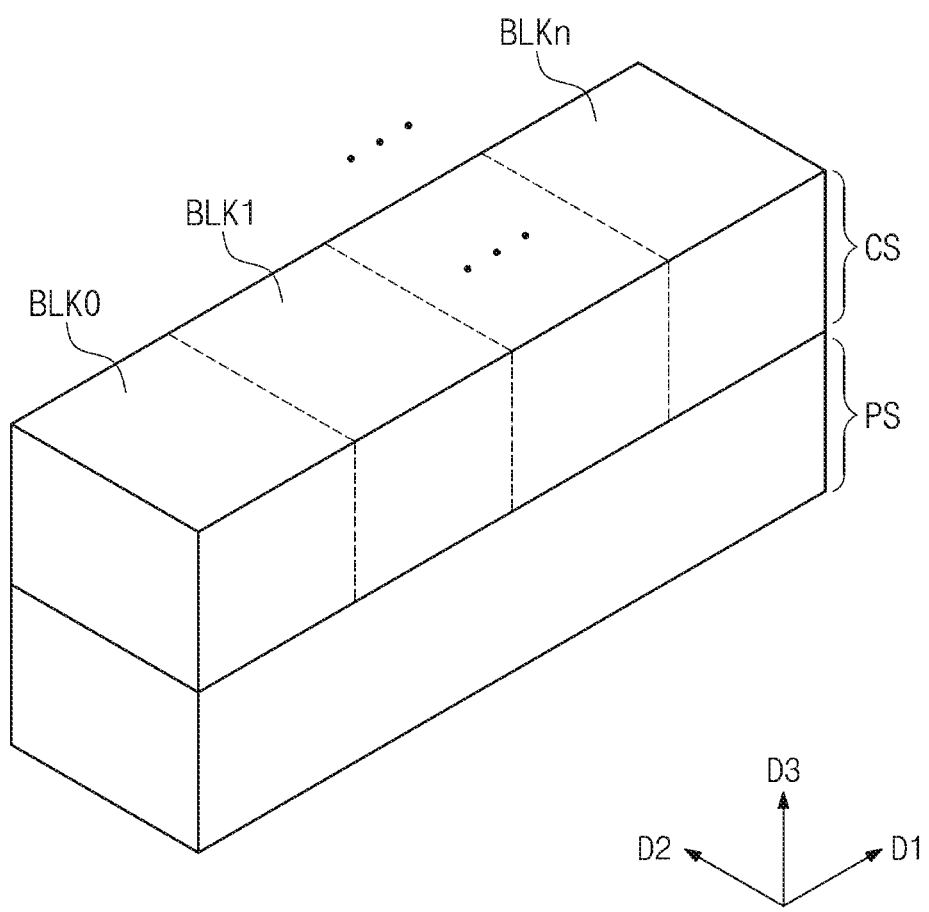
FIG. 3 is a perspective view schematically illustrating a 3D semiconductor memory device according to some embodiments of the inventive concepts.
Figure 4:
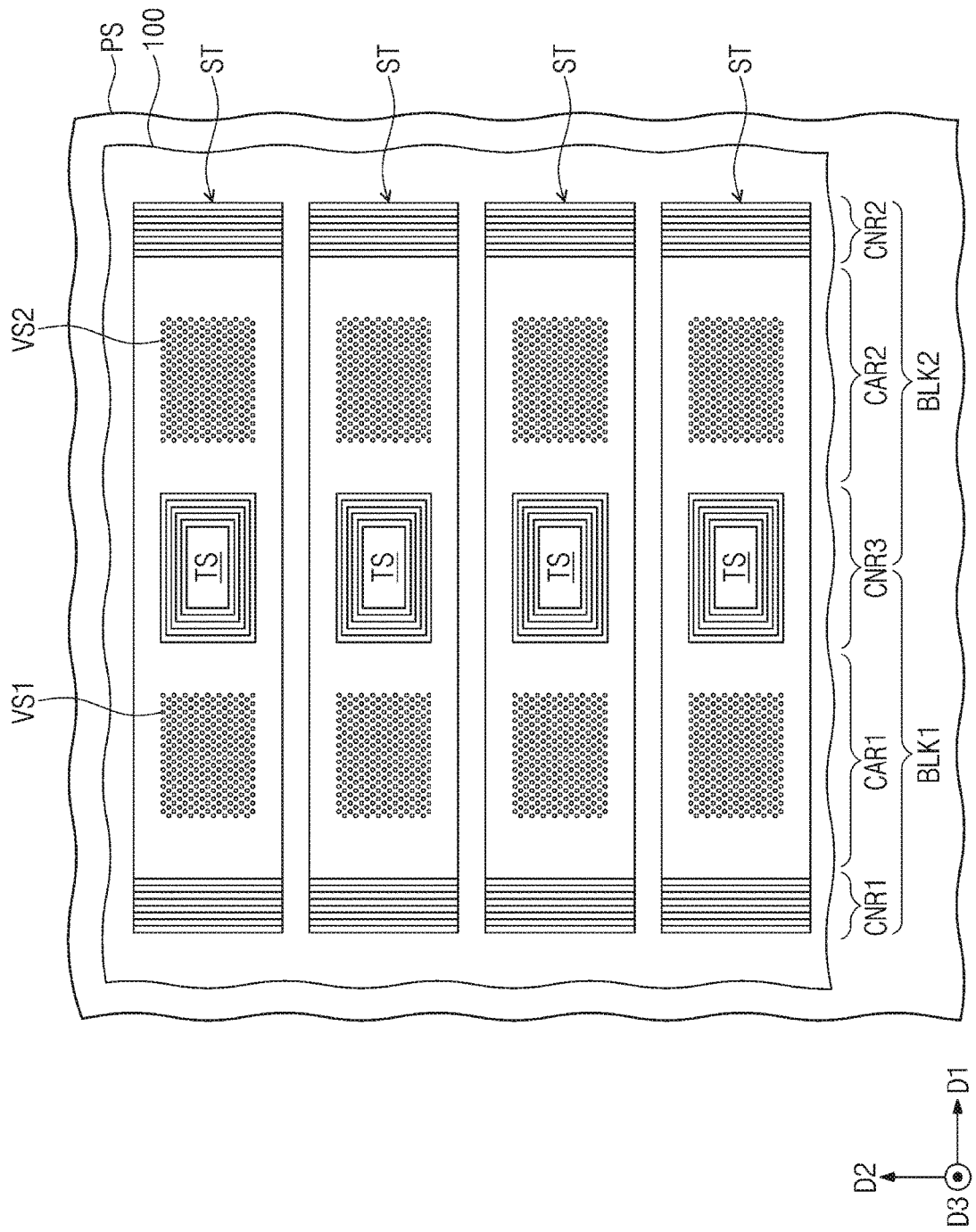
FIG. 4 is a schematic plan view illustrating a 3D semiconductor memory device according to some embodiments of the inventive concepts.

FIG. 3 is a perspective view schematically illustrating a 3D semiconductor memory device according to some embodiments of the inventive concepts. FIG. 4 is a schematic plan view illustrating a 3D semiconductor memory device according to some embodiments of the inventive concepts.

Referring to FIGS. 3 and 4, a 3D semiconductor memory device according to some embodiments may include a peripheral logic structure PS, a cell array structure CS on the peripheral logic structure PS, and a through-interconnection structure TS connecting the cell array structure CS to the peripheral logic structure PS. The cell array structure CS and the through-interconnection structure TS may overlap with the peripheral logic structure PS when viewed in a plan view. In some embodiments, the peripheral logic structure PS may include the row and column decoders 3, 5, the page buffer 4, and/or the control logic circuit 7 described with reference to FIG. 1.

The cell array structure CS may include a plurality of memory blocks BLK0 to BLKn, each of which corresponds to a data erase unit. Each of the memory blocks BLK0 to BLKn may include a memory cell array having a three-dimensional structure or a vertical structure, as described with reference to FIG. 2. In more detail, the cell array structure CS may include a plurality of electrode structures ST disposed on a horizontal semiconductor layer 100, and a plurality of vertical structures VS1 and VS2 penetrating each of the electrode structures ST.

The horizontal semiconductor layer 100 may include a first memory block region BLK1 and a second memory block region BLK2. In more detail, the horizontal semiconductor layer 100 may include a first connection region CNR1 and a second connection region CNR2 which are spaced apart from each other in a first direction D1, first and second cell array regions CARL and CAR2 between the first and second connection regions CNR1 and CNR2, and a common connection region CNR3 between the first and second cell array regions CAR1 and CAR2. The first and second memory block regions BLK1 and BLK2 may share the common connection region CNR3.

The electrode structures ST may extend from the first connection region CNR1 to the second connection region CNR2 in the first direction D1. The electrode structures ST may be spaced apart from each other in a second direction D2 intersecting the first direction D1. Here, the first and second directions D1 and D2 may be parallel to a top surface of the horizontal semiconductor layer 100.

The through-interconnection structure TS may vertically penetrate each of the electrode structures ST and the common connection region CNR3 of the horizontal semiconductor layer 100. The through-interconnection structure TS may include through-plugs and connection lines connected to the through-plugs.

Figure 5:
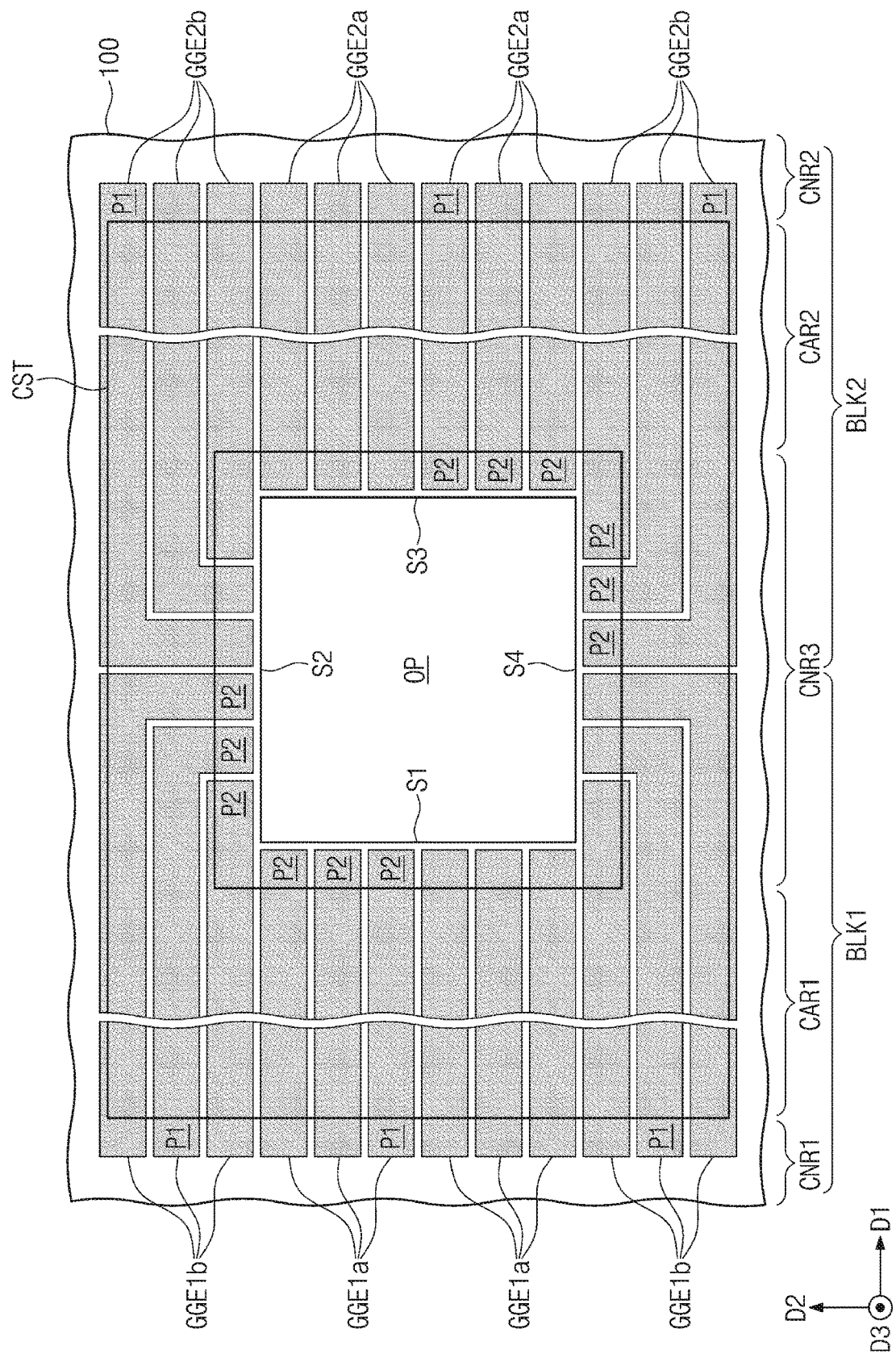
FIG. 5 is a schematic plan view illustrating an electrode structure according to some embodiments of the inventive concepts.
Figure 6:
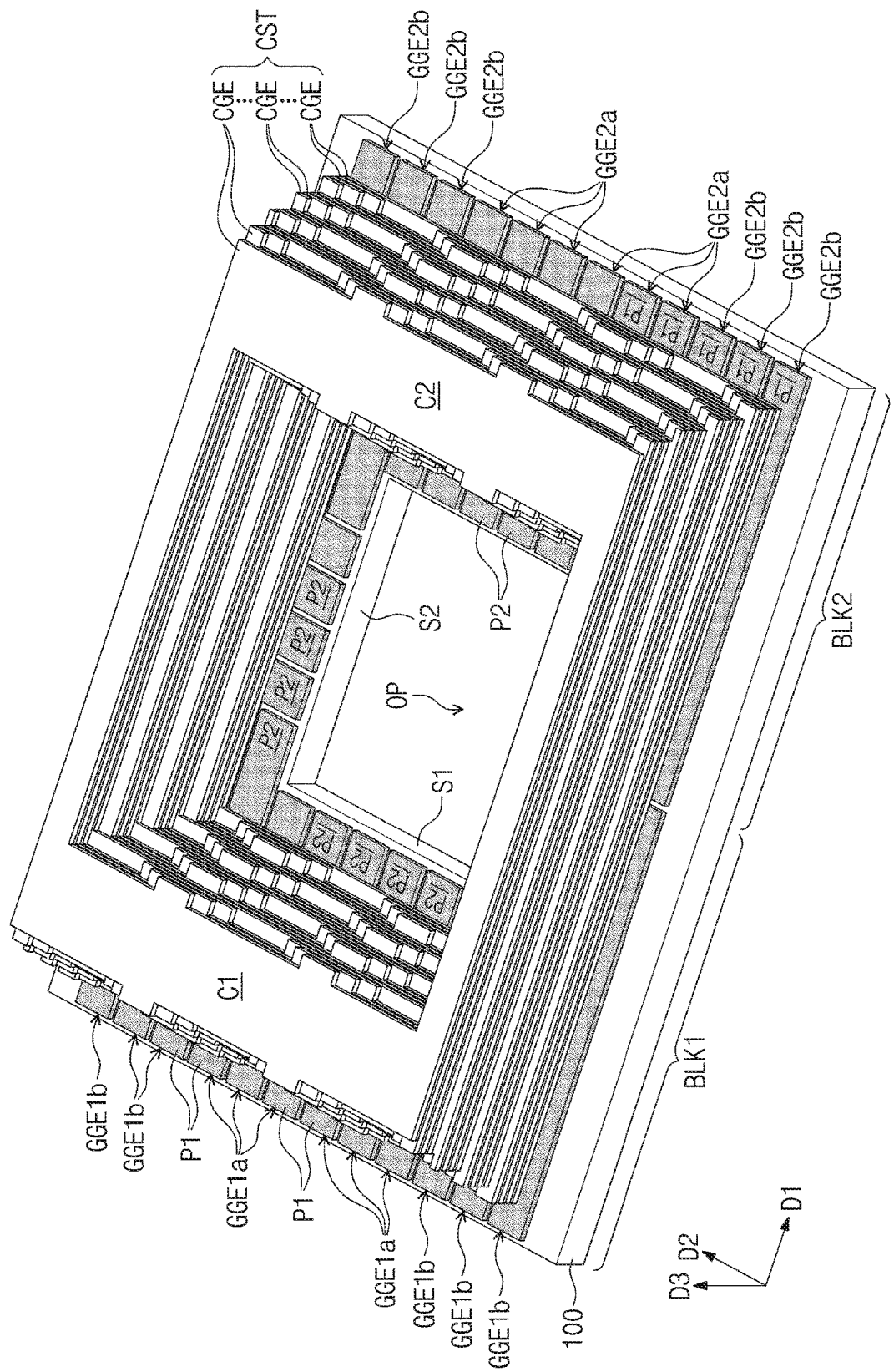
FIG. 6 is a perspective view illustrating an electrode structure according to some embodiments of the inventive concepts.

FIG. 5 is a schematic plan view illustrating an electrode structure according to some embodiments of the inventive concepts. FIG. 6 is a perspective view illustrating an electrode structure according to some embodiments of the inventive concepts.

Referring to FIGS. 5 and 6, the horizontal semiconductor layer 100 may include the first and second connection regions CNR1 and CNR2, the first and second cell array regions CAR1 and CAR2, and/or the common connection region CNR3, as described above. The horizontal semiconductor layer 100 may have an opening OP in the common connection region CNR3. The opening OP may have first and second sidewalls S1 and S2 intersecting each other, a third sidewall S3 facing the first sidewall S1, and a fourth sidewall S4 facing the second sidewall S2. For example, the first and third sidewalls S1 and S3 may be parallel to the second direction D2, and the second and fourth sidewalls S2 and S4 may be parallel to the first direction D1. The shape of the opening OP is not so limited, however.

The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs). The horizontal semiconductor layer 100 may include a semiconductor material doped with dopants of a first conductivity type and/or an intrinsic semiconductor material not doped with dopants. In addition, the horizontal semiconductor layer 100 may have a crystal structure including at least one of a single-crystalline structure, an amorphous structure, or a poly-crystalline structure.

The electrode structure ST may be disposed on the horizontal semiconductor layer 100. The electrode structure ST may include a cell electrode structure CST and a plurality of ground selection gate electrodes GGE1a, GGE1b, GGE2a and GGE2b provided between the cell electrode structure CST and the horizontal semiconductor layer 100. The plurality of ground selection gate electrodes GGE1a, GGE1b, GGE2a and GGE2b may include a plurality of first ground selection gate electrodes GGE1a and GGE1b disposed on the first cell array region CAR1 and a plurality of second ground selection gate electrodes GGE2a and GGE2b disposed on the second cell array region CAR2. In addition, the electrode structure ST may also include a plurality of string selection gate electrodes (not shown) horizontally spaced apart from each other on an uppermost cell gate electrode CGE.

The cell electrode structure CST may include a plurality of cell gate electrodes CGE stacked in a third direction D3 (e.g., a vertical direction) perpendicular to the first and second directions D1 and D2. The cell electrode structure CST may also include insulating layers (not shown) disposed between the cell gate electrodes CGE.

According to some embodiments, the ground selection gate electrodes GGE1a, GGE1b, GGE2a and GGE2b may be used as gate electrodes of the ground selection transistors GST described with reference to FIG. 2. The cell gate electrodes CGE may be used as gate electrodes of the memory cell transistors MCT described with reference to FIG. 2. The string selection gate electrodes (not shown) may be used as gate electrodes of the string selection transistors SST described with reference to FIG. 2.

The cell electrode structure CST may surround the opening OP of the horizontal semiconductor layer 100 and may extend from the first connection region CNR1 to the second connection region CNR2, when viewed in a plan view. In other words, each of the cell gate electrodes CGE may have an opening overlapping with the opening OP in the common connection region CNR3. A portion of the cell electrode structure CST on the common connection region CNR3 may have a ring shape surrounding the opening OP when viewed in a plan view. In other words, the cell electrode structure CST may not overlap with the opening OP. In more detail, the cell electrode structure CST may include a first cell array portion C1 disposed on the first cell array region CAR1, a second cell array portion C2 disposed on the second cell array region CAR2, and a connection portion disposed on the common connection region CNR3 and connecting the first cell array portion C1 and the second cell array portion C2.

The cell gate electrodes CGE may be stacked on the horizontal semiconductor layer 100 to have a stepped structure which surrounds the opening OP of the horizontal semiconductor layer 100 when viewed in a plan view. Thus, a height of the cell electrode structure CST may decrease as a distance from each of the first and second cell array regions CAR1 and CAR2 increases.

Each of the cell gate electrodes CGE may have first cell pads on the first and second connection regions CNR1 and CNR2 and a second cell pad on the common connection region CNR3. The first and second cell pads of the cell gate electrodes CGE may be disposed at positions horizontally and/or vertically different from each other. In some embodiments, the second cell pads of the cell gate electrodes CGE may form first, second, third and fourth stepped structures on the common connection region CNR3. The first and second stepped structures may face each other in the first direction D1 with the opening OP interposed therebetween when viewed in a plan view. The third and fourth stepped structures may face each other in the second direction D2 with the opening OP interposed therebetween when viewed in a plan view. The first cell pads of the cell gate electrodes CGE may form a fifth stepped structure on the first connection region CNR1 and may form a sixth stepped structure on the second connection region CNR2.

In some embodiments, the cell electrode structure CST may overlap with the first and second ground selection gate electrodes GGE1a, GGE1b, GGE2a and GGE2b when viewed in a plan view. The first ground selection gate electrodes GGE1a and GGE1b may be disposed on the first connection region CNR1, the first cell array region CAR1, and the common connection region CNR3. The second ground selection gate electrodes GGE2a and GGE2b may be spaced apart from the first ground selection gate electrodes GGE1a and GGE1b and may be disposed on the second connection region CNR2, the second cell array region CAR2, and the common connection region CNR3.

The first ground selection gate electrodes GGE1a and GGE1b may have long axes in the first direction D1 and may be spaced apart from each other in the second direction D2 on the first cell array region CAR1. Each of the first ground selection gate electrodes GGE1a and GGE1b may have a first pad P1 on the first connection region CNR1 and may have a second pad P2 on the common connection region CNR3. The first pads P1 of the first ground selection gate electrodes GGE1a and GGE1b may be spaced apart from the second pads P2 of the first ground selection gate electrodes GGE1a and GGE1b with the first cell array portion C1 of the cell electrode structure CST interposed therebetween when viewed in a plan view. The first and second pads P1 and P2 of the first ground selection gate electrodes GGE1a and GGE1b may not overlap with the cell electrode structure CST.

The first ground selection gate electrodes GGE1a and GGE1b may include first gate electrodes GGE1a of which the second pads P2 are disposed adjacent to the first sidewall S1 of the opening OP, and second gate electrodes GGE1b of which the second pads P2 are disposed adjacent to the second sidewall S2 of the opening OP. Each of the first gate electrodes GGE1a may have a substantially uniform width and may extend in the first direction D1. Each of the second gate electrodes GGE1b may include an electrode portion extending in the first direction D1 and an extension extending in the second direction D2 intersecting the first direction D1. In each of the second gate electrodes GGE1b, the electrode portion may have the first pad P1 and the extension may have the second pad P2.

Likewise, the second ground selection gate electrodes GGE2a and GGE2b may have long axes in the first direction D1 and may be spaced apart from each other in the second direction D2 on the second cell array region CAR2. The second ground selection gate electrodes GGE2a and GGE2b may include third gate electrodes GGE2a of which the second pads P2 are disposed adjacent to the third sidewall S3 of the opening OP, and fourth gate electrodes GGE2b of which the second pads P2 are disposed adjacent to the fourth sidewall S4 of the opening OP.

The second ground selection gate electrodes GGE2a and GGE2b and the first ground selection gate electrodes GGE1a and GGE1b may be mirror-symmetrical when viewed in a plan view. Each of the second ground selection gate electrodes GGE2a and GGE2b may have a first pad P1 on the second connection region CNR2 and may have a second pad P2 on the common connection region CNR3. The first pads P1 of the second ground selection gate electrodes GGE2a and GGE2b may be spaced apart from the second pads P2 of the second ground selection gate electrodes GGE2a and GGE2b with the second cell array portion C2 of the cell electrode structure CST interposed therebetween when viewed in a plan view. The first and second pads P1 and P2 of the second ground selection gate electrodes GGE2a and GGE2b may not overlap with the cell electrode structure CST.

The first pads P1 of the first ground selection gate electrodes GGE1a and GGE1b may be adjacent to the fifth stepped structure of the cell electrode structure CST, and the first pads P1 of the second ground selection gate electrodes GGE2a and GGE2b may be adjacent to the sixth stepped structure of the cell electrode structure CST.

The second pads P2 of the first and second ground selection gate electrodes GGE1a, GGE1b, GGE2a and GGE2b may be disposed around the opening OP of the horizontal semiconductor layer 100 when viewed in a plan view. For example, some of the second pads P2 of the first ground selection gate electrodes GGE1a and GGE1b may be adjacent to the first sidewall S1 of the opening OP, and the others of the second pads P2 of the first ground selection gate electrodes GGE1a and GGE1b may be adjacent to the second and fourth sidewalls S2 and S4 of the opening OP. In addition, some of the second pads P2 of the second ground selection gate electrodes GGE2a and GGE2b may be adjacent to the third sidewall S3 of the opening OP, and the others of the second pads P2 of the second ground selection gate electrodes GGE2a and GGE2b may be adjacent to the second and fourth sidewalls S2 and S4 of the opening OP.

Figure 7:
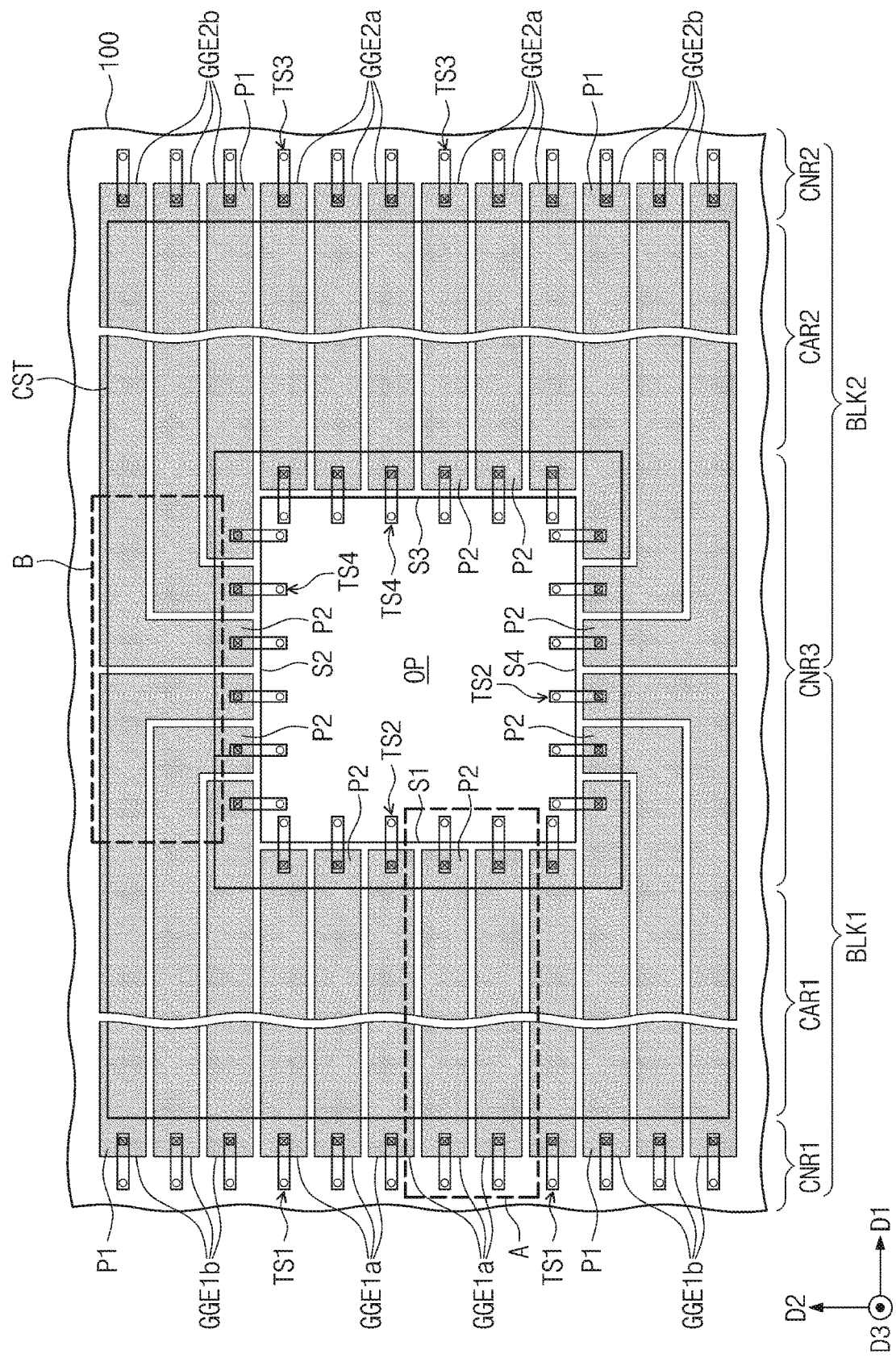
FIG. 7 is a schematic plan view illustrating a 3D semiconductor memory device according to some embodiments of the inventive concepts.
Figure 8:
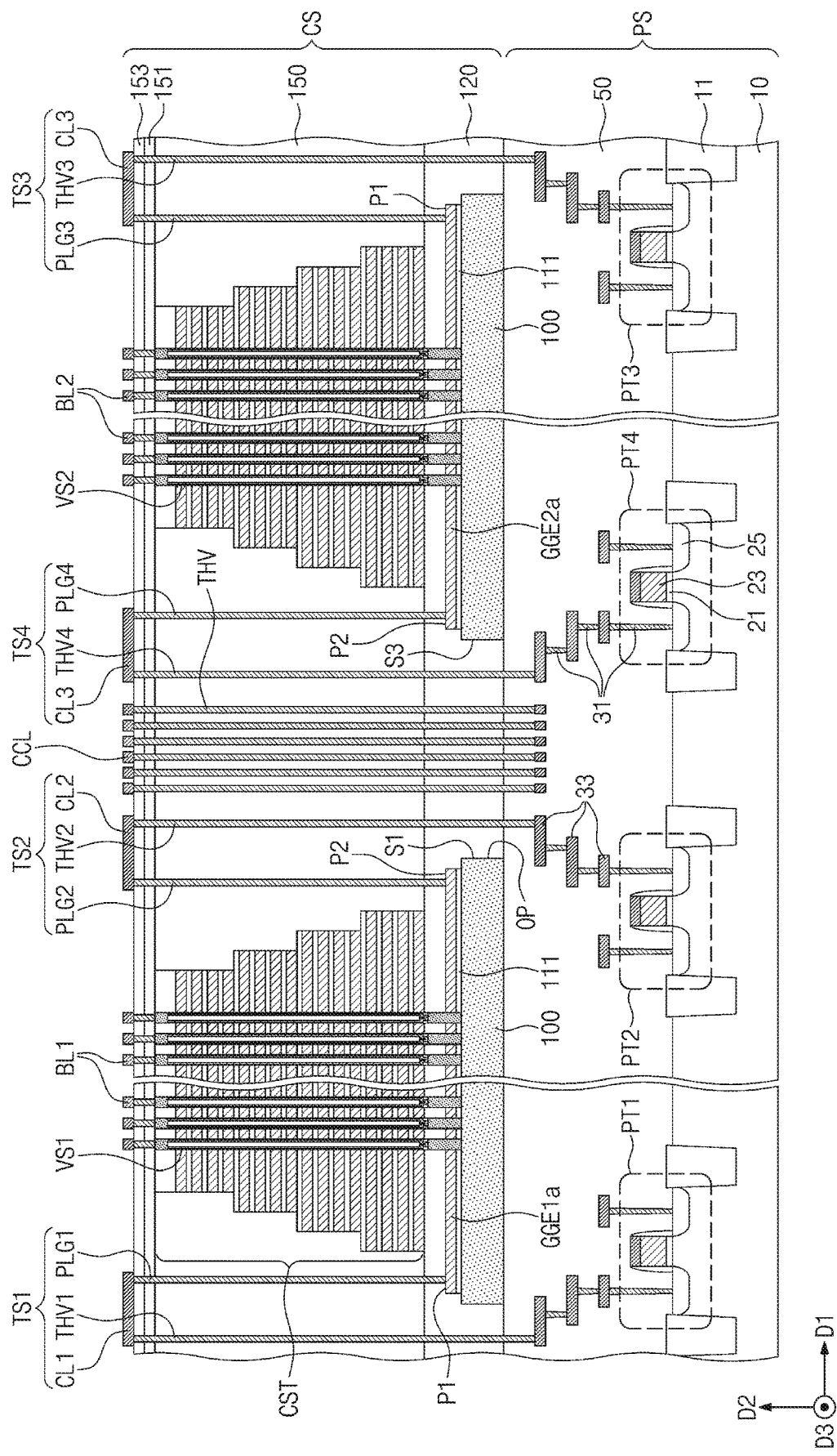
FIGS. 8 and 9 are cross-sectional views illustrating a 3D semiconductor memory device according to some embodiments of the inventive concepts.
Figure 9:
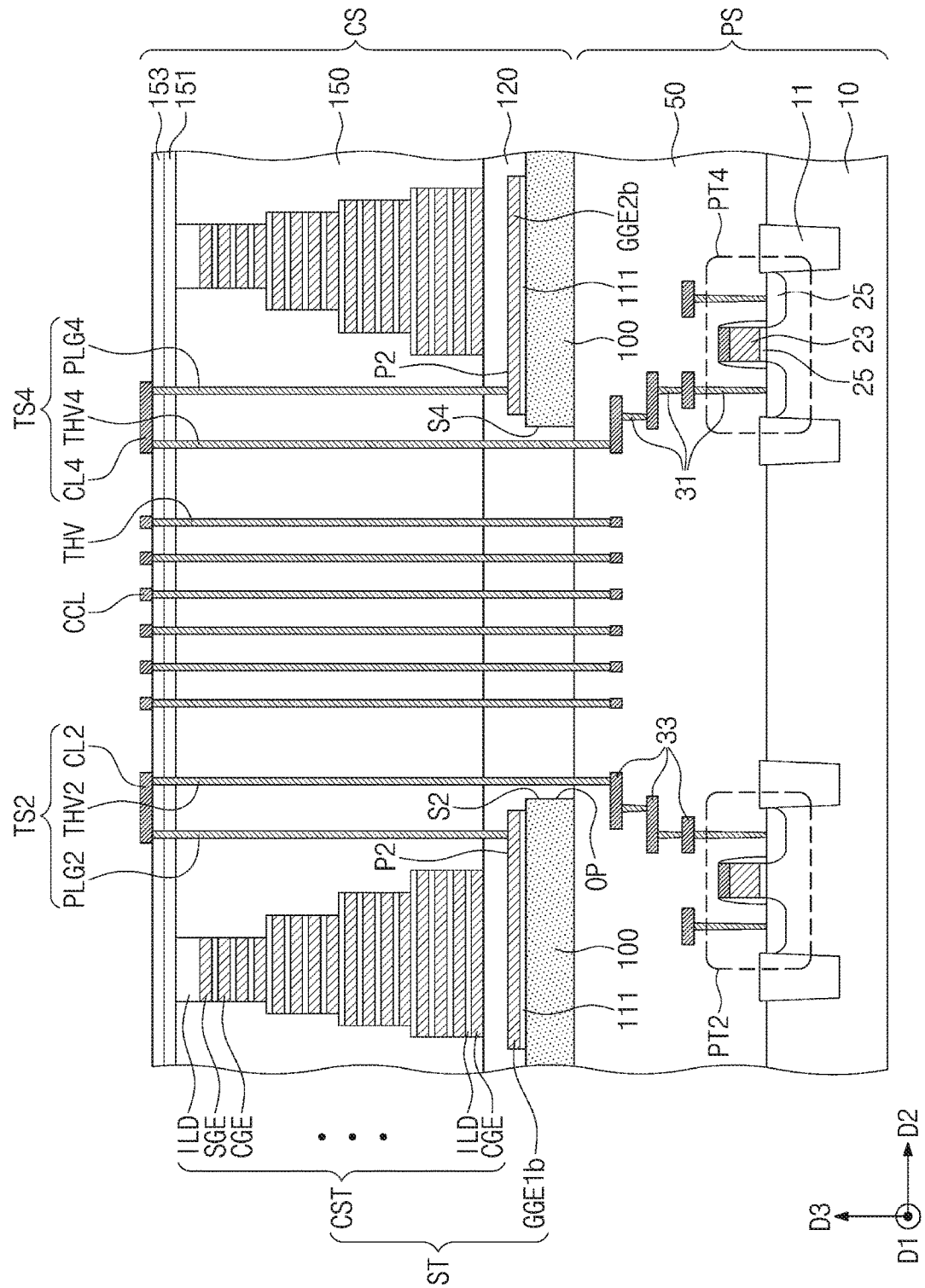
Figure 10:
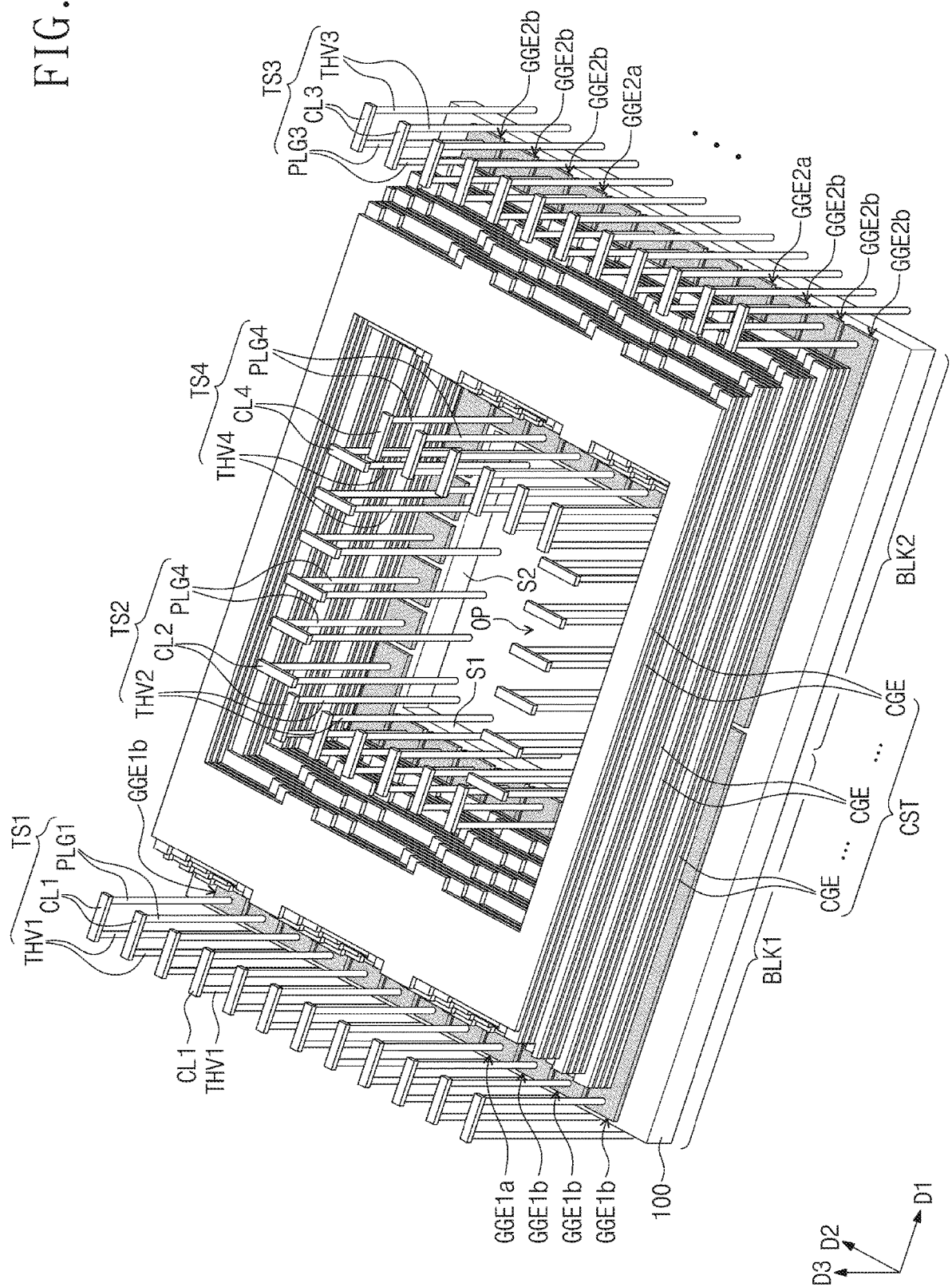
FIG. 10 is a perspective view illustrating an electrode structure and a through-interconnection structure according to some embodiments of the inventive concepts.
Figure 11A:
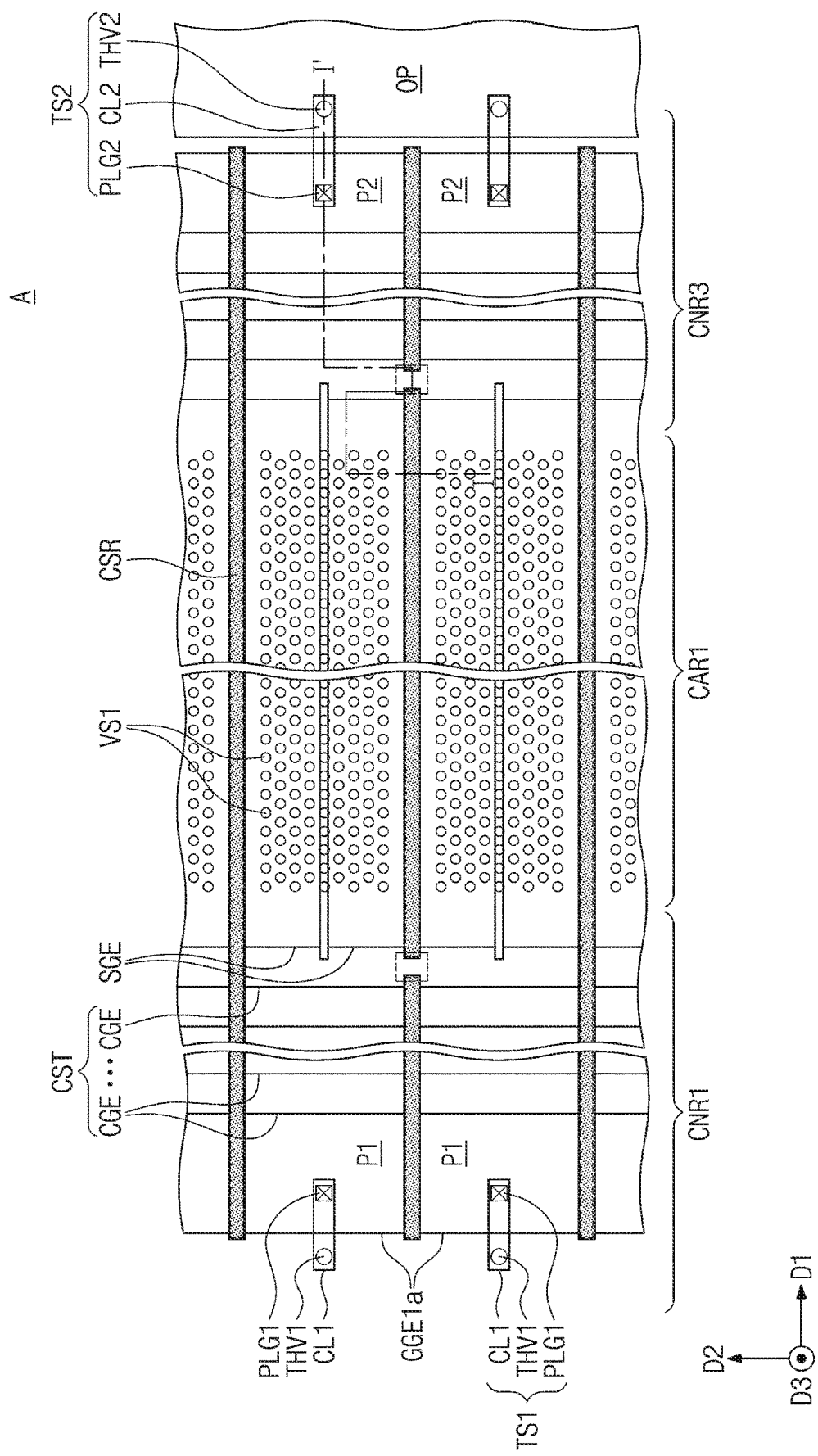
FIGS. 11A and 11B are enlarged views of portions 'A' and 'B' of FIG. 7, respectively.
Figure 11B:
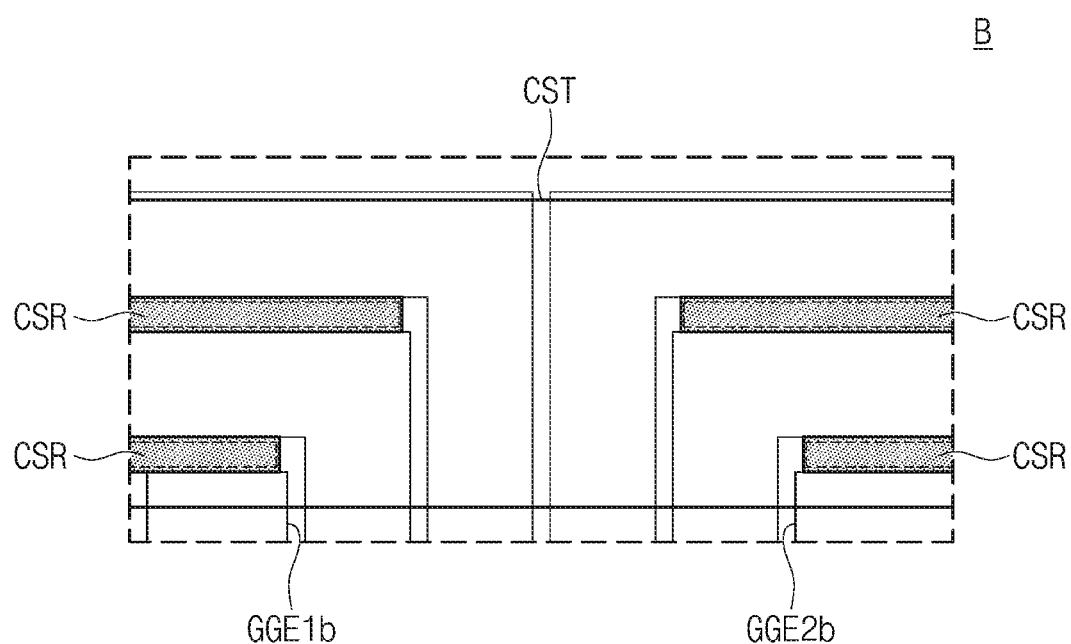
Figure 11C:
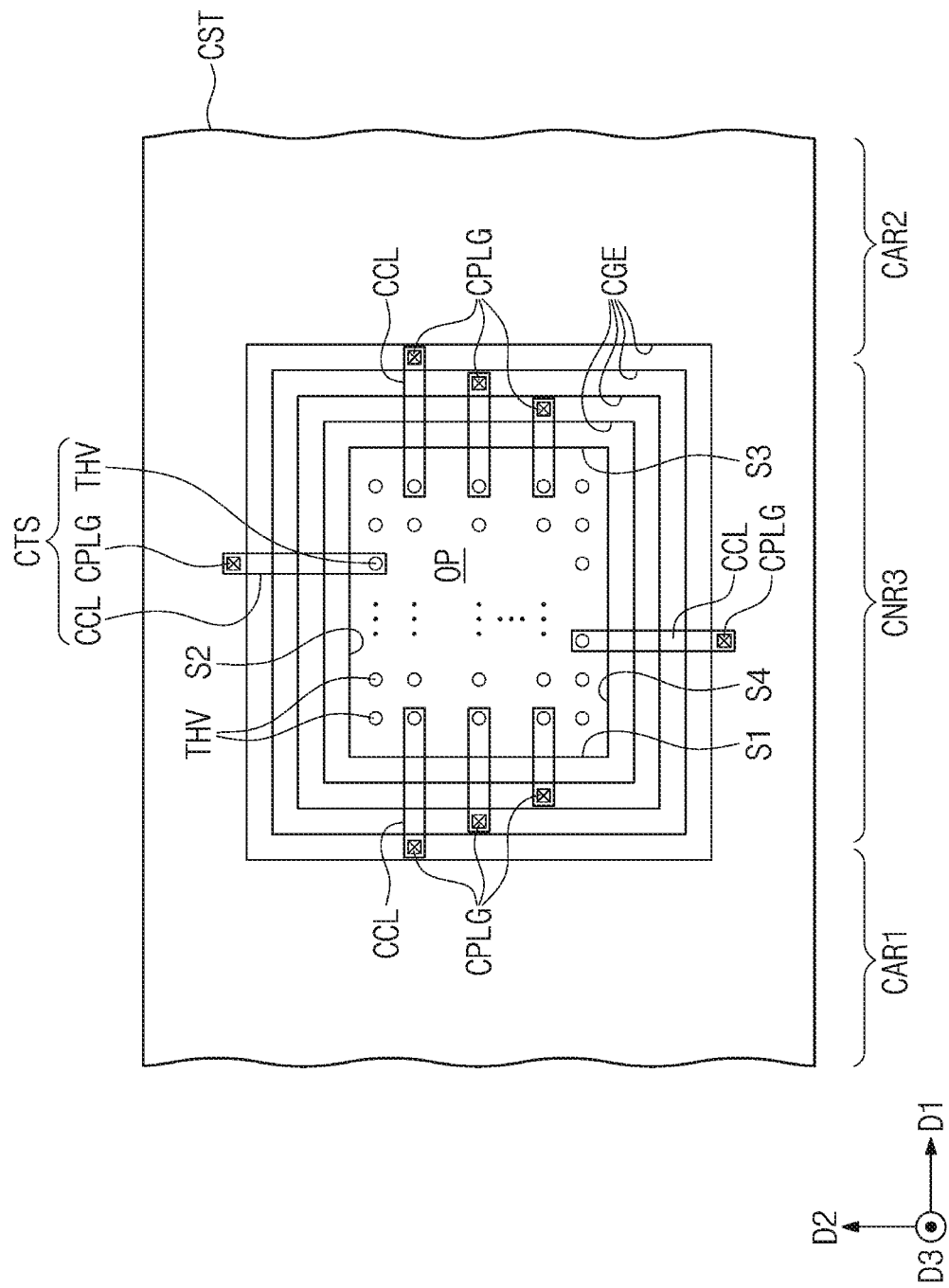
FIG. 11C is a plan view illustrating a cell electrode structure and an interconnection structure.
Figure 12:
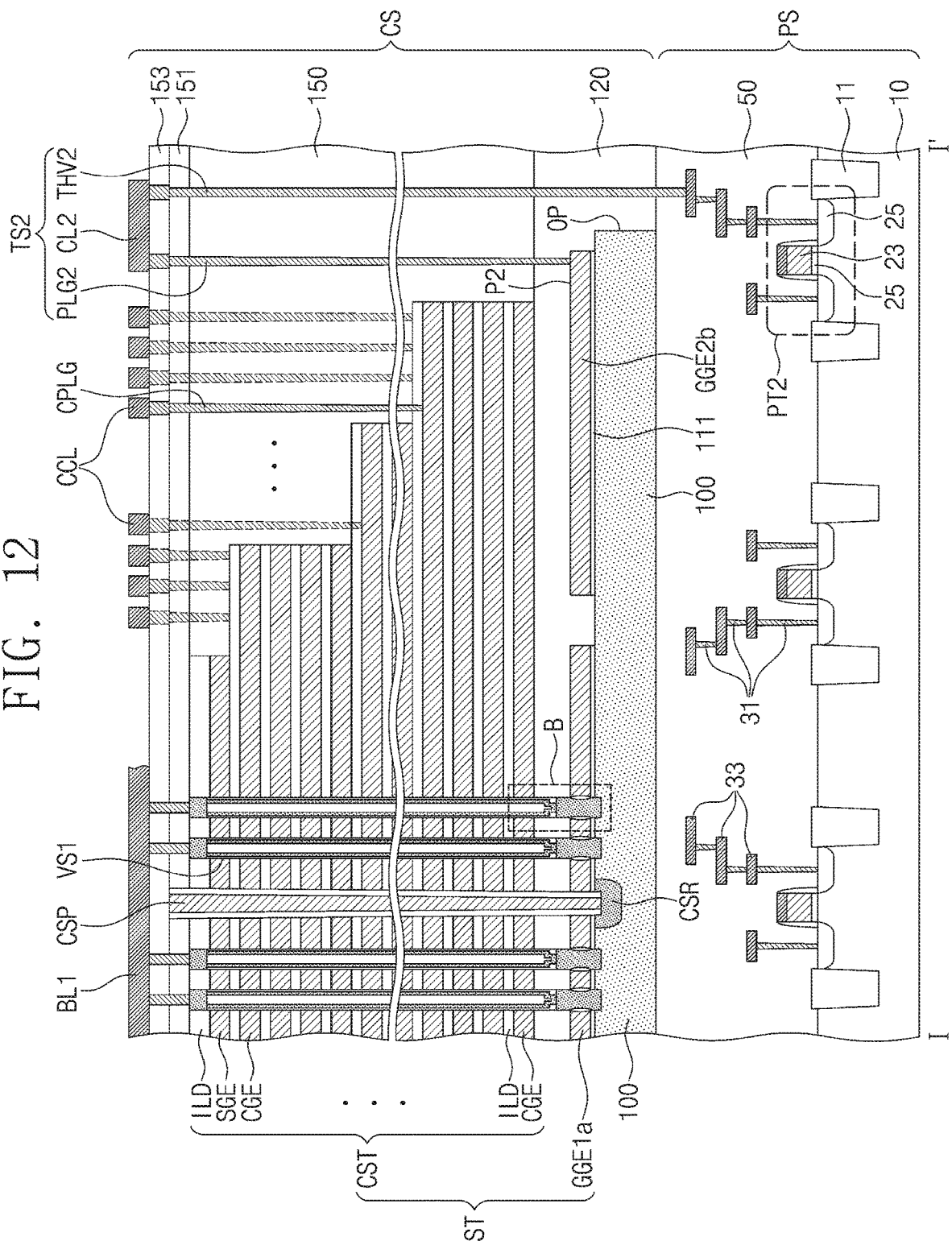
FIG. 12 is a cross-sectional view taken along a line I-I' of FIG. 11A.
Figure 13A:
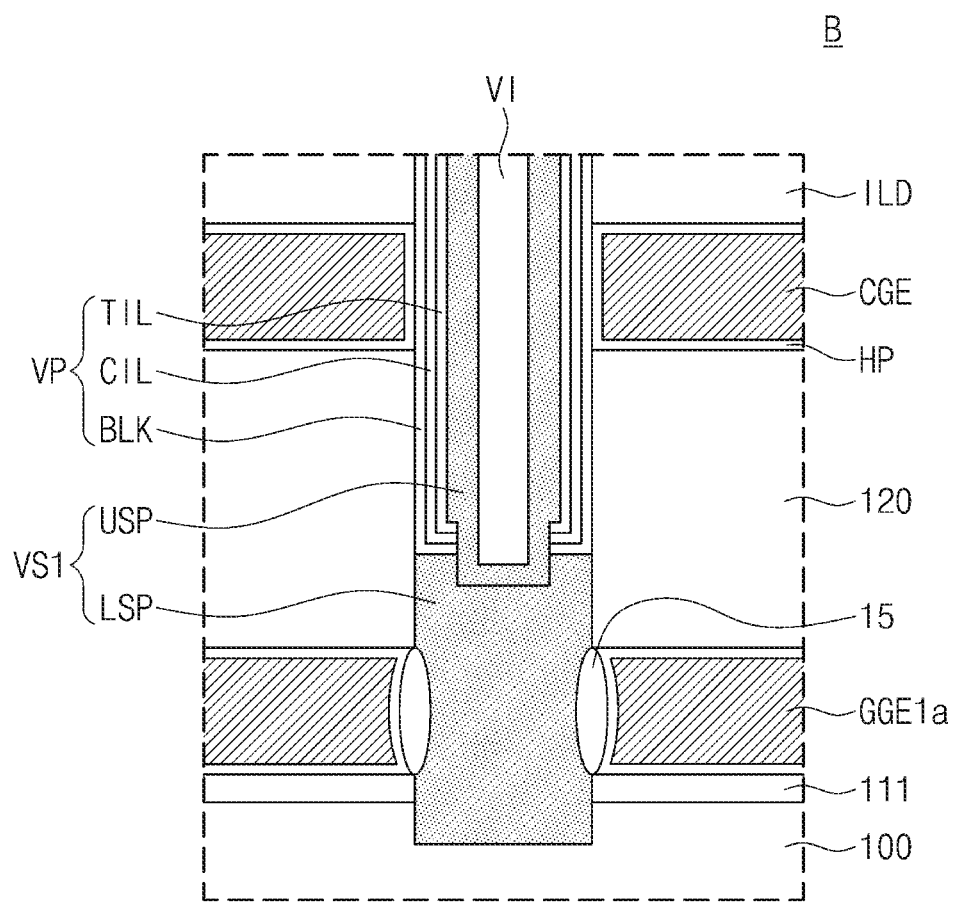
FIGS. 13A and 13B are enlarged views of a portion 'B' of FIG. 12.
Figure 13B:
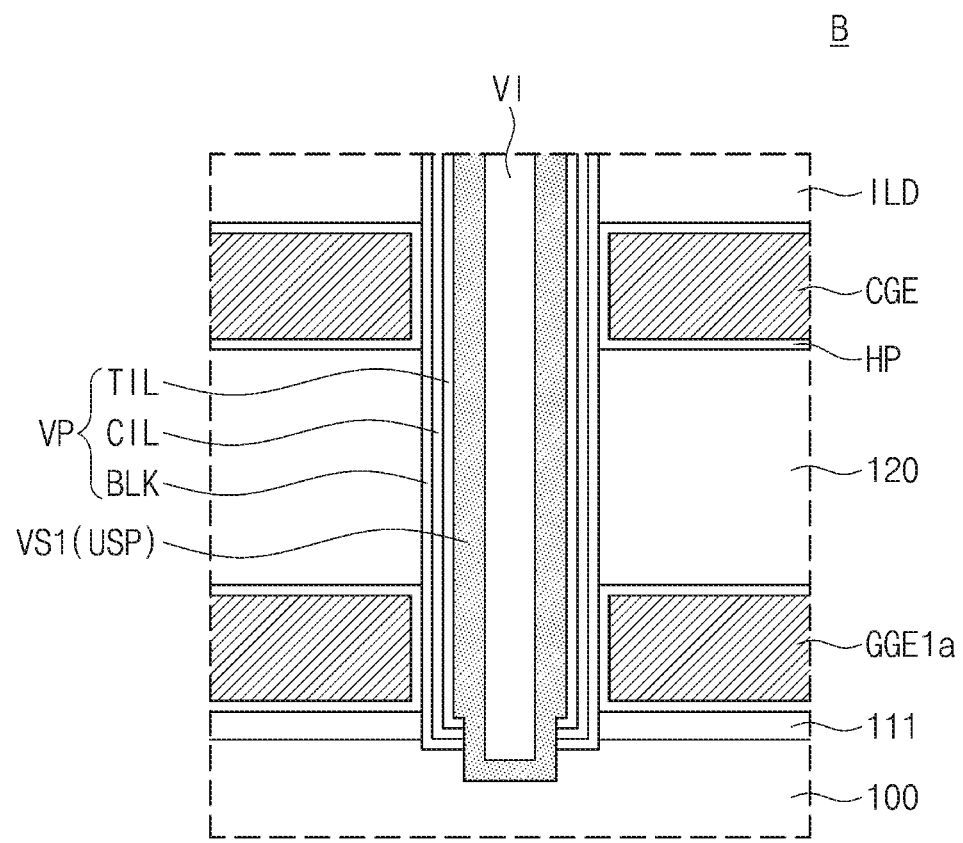

FIG. 7 is a schematic plan view illustrating a 3D semiconductor memory device according to some embodiments of the inventive concepts. FIGS. 8 and 9 are cross-sectional views illustrating a 3D semiconductor memory device according to some embodiments of the inventive concepts. FIG. 10 is a perspective view illustrating an electrode structure and a through-interconnection structure according to some embodiments of the inventive concepts. FIGS. 11A and 11B are enlarged views of portions 'A' and 'B' of FIG. 7, respectively. FIG. 11C is a plan view illustrating a cell electrode structure and an interconnection structure. FIG. 12 is a cross-sectional view taken along a line I-I' of FIG. 11A. FIGS. 13A and 13B are enlarged views of a portion 'B' of FIG. 12.

Hereinafter, the descriptions to the same technical features as in the embodiments of FIGS. 5 and 6 will be omitted or mentioned briefly for the purpose of ease and convenience in explanation.

Referring to FIGS. 7, 8, 9 and 10, a peripheral logic structure PS may include peripheral logic circuits integrated on an entire top surface of a semiconductor substrate 10, and a peripheral buried insulating layer 50 covering the peripheral logic circuits.

The semiconductor substrate 10 may include a silicon substrate, a silicon-germanium substrate, a germanium substrate, or a single-crystalline epitaxial layer grown on a single-crystalline silicon substrate. The semiconductor substrate 10 may include well regions doped with dopants, and active regions defined by a device isolation layer 11.

The peripheral logic circuits may include the row and column decoders, the page buffer and the control logic circuit described above and may include NMOS and PMOS transistors, low-voltage and high-voltage transistors and a resistor, which are integrated on the semiconductor substrate 10. In some embodiments, the peripheral logic structure PS may include first and second pass transistors PT1 and PT2 for controlling first ground selection gate electrodes GGE1a and GGE1b, and third and fourth pass transistors PT3 and PT4 for controlling second ground selection gate electrodes GGE2a and GGE2b.

Each of the first to fourth pass transistors PT1 to PT4 may include a peripheral gate electrode 23 disposed on the semiconductor substrate 10 with a gate insulating layer 21 interposed therebetween, and source/drain regions 25 formed in the semiconductor substrate 10 at both sides of the peripheral gate electrode 23. Peripheral interconnection lines 33 may be connected to the first to fourth pass transistors PT1 to PT4 through peripheral contact plugs 31.

The peripheral buried insulating layer 50 may cover the first to fourth pass transistors PT1 to PT4, the peripheral contact plugs 31 and the peripheral interconnection lines 33 on the semiconductor substrate 10. The peripheral buried insulating layer 50 may include a plurality of stacked insulating layers.

A cell array structure CS may be disposed on the peripheral buried insulating layer 50 and may include a horizontal semiconductor layer 100, an electrode structure ST, vertical structures VS1 and VS2, and through-interconnection structures TS1, TS2, TS3 and TS4 connecting the cell array structure CS and the peripheral logic structure PS.

The horizontal semiconductor layer 100 may include first and second connection regions CNR1 and CNR2, first and second cell array regions CAR1 and CAR2, and a common connection region CNR3, as described above. The horizontal semiconductor layer 100 may have an opening OP in the common connection region CNR3, and the opening OP may expose the peripheral buried insulating layer 50.

The electrode structure ST described with reference to FIGS. 5 and 6 may be disposed on the horizontal semiconductor layer 100. In detail, a plurality of the first and second ground selection gate electrodes GGE1a, GGE1b, GGE2a and GGE2b may be disposed on the horizontal semiconductor layer 100 with a buffer insulating layer 111 interposed therebetween.

The first ground selection gate electrodes GGE1a and GGE1b may have first pads P1 on the first connection region CNR1 and may have second pads P2 on the common connection region CNR3. Likewise, the second ground selection gate electrodes GGE2a and GGE2b may have first pads P1 on the second connection region CNR2 and may have second pads P2 on the common connection region CNR3. As described above with reference to FIGS. 5 and 6, the second pads P2 of the first and second ground selection gate electrodes GGE1a, GGE1b, GGE2a and GGE2b may be disposed around the opening OP when viewed in a plan view.

A lower planarization insulating layer 120 may cover the first and second ground selection gate electrodes GGE1a, GGE1b, GGE2a and GGE2b and may fill the opening OP of the horizontal semiconductor layer 100. The lower planarization insulating layer 120 may have a substantially flat top surface.

A cell electrode structure CST of the electrode structure ST may be disposed on the lower planarization insulating layer 120. The cell electrode structure CST may include cell gate electrodes CGE and interlayer insulating layers ILD, which are alternately stacked on the lower planarization insulating layer 120.

As described above, the cell electrode structure CST may have various stepped structures on the first and second connection regions CNR1 and CNR2 and the common connection region CNR3. The cell electrode structure CST may have a stepped structure surrounding the opening OP on the common connection region CNR3 when viewed in a plan view. For example, the cell gate electrodes CGE may form first, second, third and fourth stepped structures on the common connection region CNR3. In addition, the cell gate electrodes CGE may form a fifth stepped structure on the first connection region CNR1 and may form a sixth stepped structure on the second connection region CNR2.

First vertical structures VS1 may penetrate the electrode structure ST on the first cell array region CAR1, and second vertical structures VS2 may penetrate the electrode structure ST on the second cell array region CAR2. The first vertical structures VS1 may be arranged along rows and columns and may be arranged in a zigzag form, when viewed in a plan view. The second vertical structures VS2 may be arranged like the first vertical structures VS1. The first and second vertical structures VS1 and VS2 may include a semiconductor material such as silicon (Si), germanium (Ge), or a combination thereof. The first and second vertical structures VS1 and VS2 including the semiconductor material may be used as channels of the string and ground selection transistors SST and GST, the memory cell transistors MCT and the dummy cell transistors DMC, described with reference to FIG. 2. The first and second vertical structures VS1 and VS2 will be described later in more detail with reference to FIGS. 13A and 13B.

An upper planarization insulating layer 150 may be disposed on the lower planarization insulating layer 120 to cover the stepped structures of the cell electrode structure CST. The upper planarization insulating layer 150 may have a substantially flat top surface, and the top surface of the upper planarization insulating layer 150 may be disposed at substantially the same level as a top surface of the cell electrode structure CST.

First and second interlayer insulating layers 151 and 153 may be sequentially stacked on the upper planarization insulating layer 150 and may cover top surfaces of the first and second vertical structures VS1 and VS2.

First bit lines BL1 may extend in the second direction D2 on the second interlayer insulating layer 153 of the first cell array region CAR1 to intersect the electrode structure ST. The first bit lines BL1 may be electrically connected to the first vertical structures VS1 through bit line contact plugs. Second bit lines BL2 may extend in the second direction D2 on the second interlayer insulating layer 153 of the second cell array region CAR2 to intersect the electrode structure ST. The second bit lines BL2 may be electrically connected to the second vertical structures VS2 through bit line contact plugs.

In some embodiments, first, second, third and fourth through-interconnection structures TS1, TS2, TS3 and TS4 may connect the first and second ground selection gate electrodes GGE1a, GGE1b, GGE2a and GGE2b of the cell array structure CS to the peripheral logic structure PS.

In some embodiments, each of the first ground selection gate electrodes GGE1a and GGE1b may be connected to the first and second pass transistors PT1 and PT2 through the first and second through-interconnection structures TS1 and TS2. Each of the first ground selection gate electrodes GGE1a and GGE1b may be driven in both directions by the first and second pass transistors PT1 and PT2. In other words, the first and second pass transistors PT1 and PT2 may be controlled by a common control signal.

In more detail, the first through-interconnection structure TS1 may be provided on the first connection region CNR1 and may connect the first pads P1 of the first ground selection gate electrodes GGE1a and GGE1b to the first pass transistors PT1. The first through-interconnection structure TS1 may include first contact plugs PLG1 connected to the first pads P1 of the first ground selection gate electrodes GGE1a and GGE1b, first through-plugs THV1 penetrating the upper and lower planarization insulating layers 150 and 120 and the peripheral buried insulating layer 50 so as to be connected to the peripheral interconnection lines 33, and first connection lines CL1 connecting the first contact plugs PLG1 to the first through-plugs THV1.

The second through-interconnection structure TS2 may be provided on the common connection region CNR3 and may connect the second pads P2 of the first ground selection gate electrodes GGE1a and GGE1b to the second pass transistors PT2. The second through-interconnection structure TS2 may include second contact plugs PLG2 connected to the second pads P2 of the first ground selection gate electrodes GGE1a and GGE1b, second through-plugs THV2 penetrating the upper and lower planarization insulating layers 150 and 120 and the peripheral buried insulating layer 50 so as to be connected to the peripheral interconnection lines 33, and second connection lines CL2 connecting the second contact plugs PLG2 to the second through-plugs THV2.

In some embodiments, each of the second ground selection gate electrodes GGE2a and GGE2b may be connected to the third and fourth pass transistors PT3 and PT4 through the third and fourth through-interconnection structures TS3 and TS4. Each of the second ground selection gate electrodes GGE2a and GGE2b may be driven in both directions by the third and fourth pass transistors PT3 and PT4.

In more detail, the third through-interconnection structure TS3 may be provided on the second connection region CNR2 and may connect the first pads P1 of the second ground selection gate electrodes GGE2a and GGE2b to the third pass transistors PT3. The third through-interconnection structure TS3 may include third contact plugs PLG3 connected to the first pads P1 of the second ground selection gate electrodes GGE2a and GGE2b, third through-plugs THV3 penetrating the upper and lower planarization insulating layers 150 and 120 and the peripheral buried insulating layer 50 so as to be connected to the peripheral interconnection lines 33, and third connection lines CL3 connecting the third contact plugs PLG3 to the third through-plugs THV3.

The fourth through-interconnection structure TS4 may be provided on the common connection region CNR3 and may connect the second pads P2 of the second ground selection gate electrodes GGE2a and GGE2b to the fourth pass transistors PT4. The fourth through-interconnection structure TS4 may include fourth contact plugs PLG4 connected to the second pads P2 of the second ground selection gate electrodes GGE2a and GGE2b, fourth through-plugs THV4 penetrating the upper and lower planarization insulating layers 150 and 120 and the peripheral buried insulating layer 50 so as to be connected to the peripheral interconnection lines 33, and fourth connection lines CL4 connecting the fourth contact plugs PLG4 to the fourth through-plugs THV4.

Referring to FIGS. 11A, 11B, 11C and 12, according to some embodiments, gate separation regions penetrating the electrode structure ST may be provided on the first and second cell array regions CAR1 and CAR2. Common source regions CSR may be provided in the horizontal semiconductor layer 100 under the gate separation regions penetrating the electrode structure ST. The common source regions CSR may extend in the first direction D1. The common source regions CSR may include dopants of which a conductivity type is opposite to that of the horizontal semiconductor layer 100. For example, the common source regions CSR may include N-type dopants (e.g., arsenic (As) or phosphorus (P)). Common source plugs CSP may be formed in the gate separation regions filled with an insulating material. The common source plugs CSP may be connected to the common source regions CSR.

The gate separation regions may extend in the first direction D1, and some of the gate separation regions may have different lengths in the first direction D1. Each of the cell gate electrodes CGE may have a portion that overlaps with an empty space between adjacent ground selection gate electrodes GGE1a, GGE1b, GGE2a and GGE2b when viewed in a plan view.

The gate separation regions may extend from the first connection region CNR1 to the common connection region CNR3 in the first direction D1 when viewed in a plan view. The gate separation regions may be spaced apart from each other in the second direction D2.

Referring to FIGS. 11C and 12, cell through-interconnection structures CTS connecting the cell gate electrodes CGE to the peripheral logic structure PS may be provided. The cell through-interconnection structures CTS may include cell contact plugs CPLG connected to first and second cell pads of the cell gate electrodes CGE, cell through-plugs THV penetrating the upper and lower planarization insulating layers 150 and 120 and the peripheral buried insulating layer 50 so as to be connected to the peripheral logic circuits, and cell connection lines CCL connecting the cell contact plugs CPLG to the cell through-plugs THV, respectively. The cell through-plugs THV may be disposed in the opening OP of the horizontal semiconductor layer 100 when viewed in a plan view.

Since the cell electrode structure CST is formed to surround the opening OP in a plan view, the cell contact plugs CPLG may be connected to the cell pads of the cell gate electrodes CGE in substantially all directions in a plan view, and the cell connection lines CCL may be connected to the cell contact plugs CPLG in substantially all directions in a plan view. In some embodiments, the cell connection lines CCL may intersect the first to fourth sidewalls S1, S2, S3 and S4 of the opening OP when viewed in a plan view.

Referring to FIG. 13A, each of the vertical structures VS1 and VS2 may include a lower semiconductor pattern LSP and an upper semiconductor pattern USP. The lower semiconductor pattern LSP may be an epitaxial pattern grown from the horizontal semiconductor layer 100. The lower semiconductor pattern LSP may have a pillar shape, and a top surface of the lower semiconductor pattern LSP may be higher than a top surface of the ground selection gate electrode GGE corresponding to the lowermost layer. The upper semiconductor pattern USP may be connected to the lower semiconductor pattern LSP and may include silicon (Si), germanium (Ge), or a combination thereof. The upper semiconductor pattern USP may have a pipe or macaroni shape which has a closed bottom end and is connected to the lower semiconductor pattern LSP. An inner space of the upper semiconductor pattern USP having this shape may be filled with a filling insulation pattern VI.

In certain embodiments, referring to FIG. 13B, the lower semiconductor pattern LSP of FIG. 13A may be omitted, and a vertical structure VS1 may have the upper semiconductor pattern USP of FIG. 13A. In this case, the vertical structure VS1 (i.e., USP) may be connected directly to the horizontal semiconductor layer 100.

In addition, referring to FIGS. 13A and 13B, a vertical insulating pattern VP may be disposed between the electrode structure ST and the vertical structure VS1. The vertical insulating pattern VP may have a pipe or macaroni shape of which top and bottom ends are opened. The vertical insulating pattern VP may extend in the third direction D3 and may surround a sidewall of each of the vertical structures VS1 and VS2. When each of the vertical structures VS1 and VS2 includes the lower and upper semiconductor patterns LSP and USP, the vertical insulating pattern VP may surround a sidewall of the upper semiconductor pattern USP.

In some embodiments, the vertical insulating pattern VP may be a data storage layer of a NAND flash memory device and may include a tunnel insulating layer TIL, a charge storage layer CIL, and a blocking insulating layer BLK. For example, the charge storage layer may include a trap insulating layer, a floating gate electrode, and/or an insulating layer including conductive nano dots. Alternatively, the vertical insulating pattern VP may include a thin layer for a phase-change memory cell or a thin layer for a variable resistance memory cell.

A horizontal insulating pattern HP may be disposed between the vertical insulating pattern VP and one sidewall of each of the electrodes CGE and GGE and may extend onto top and bottom surfaces of each of the electrodes CGE and GGE. The horizontal insulating pattern HP may be a portion of the data storage layer of the NAND flash memory device and may include a blocking insulating layer.

Figure 14:
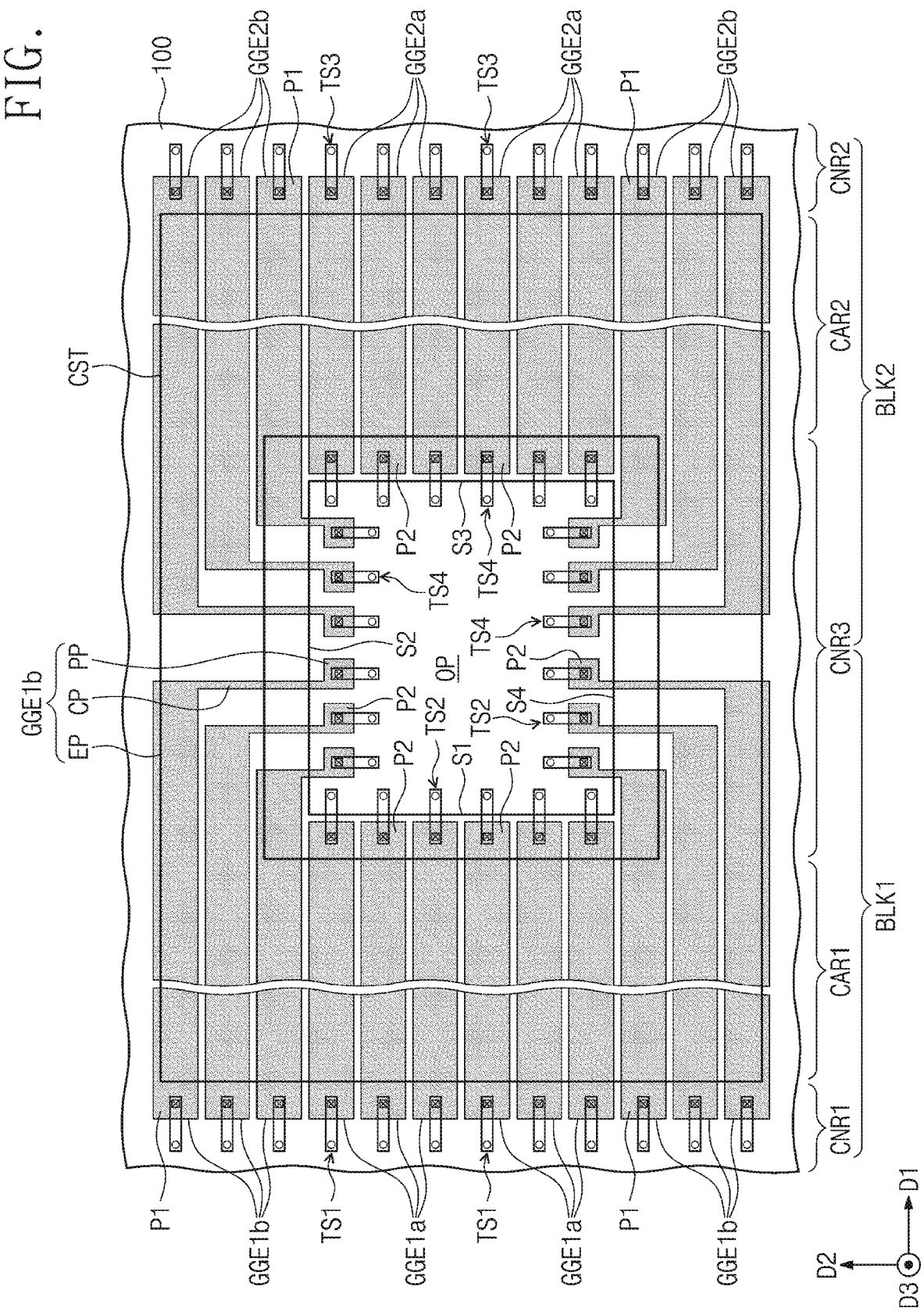
FIG. 14 is a schematic plan view illustrating a 3D semiconductor memory device according to some embodiments of the inventive concepts.
Figure 15:
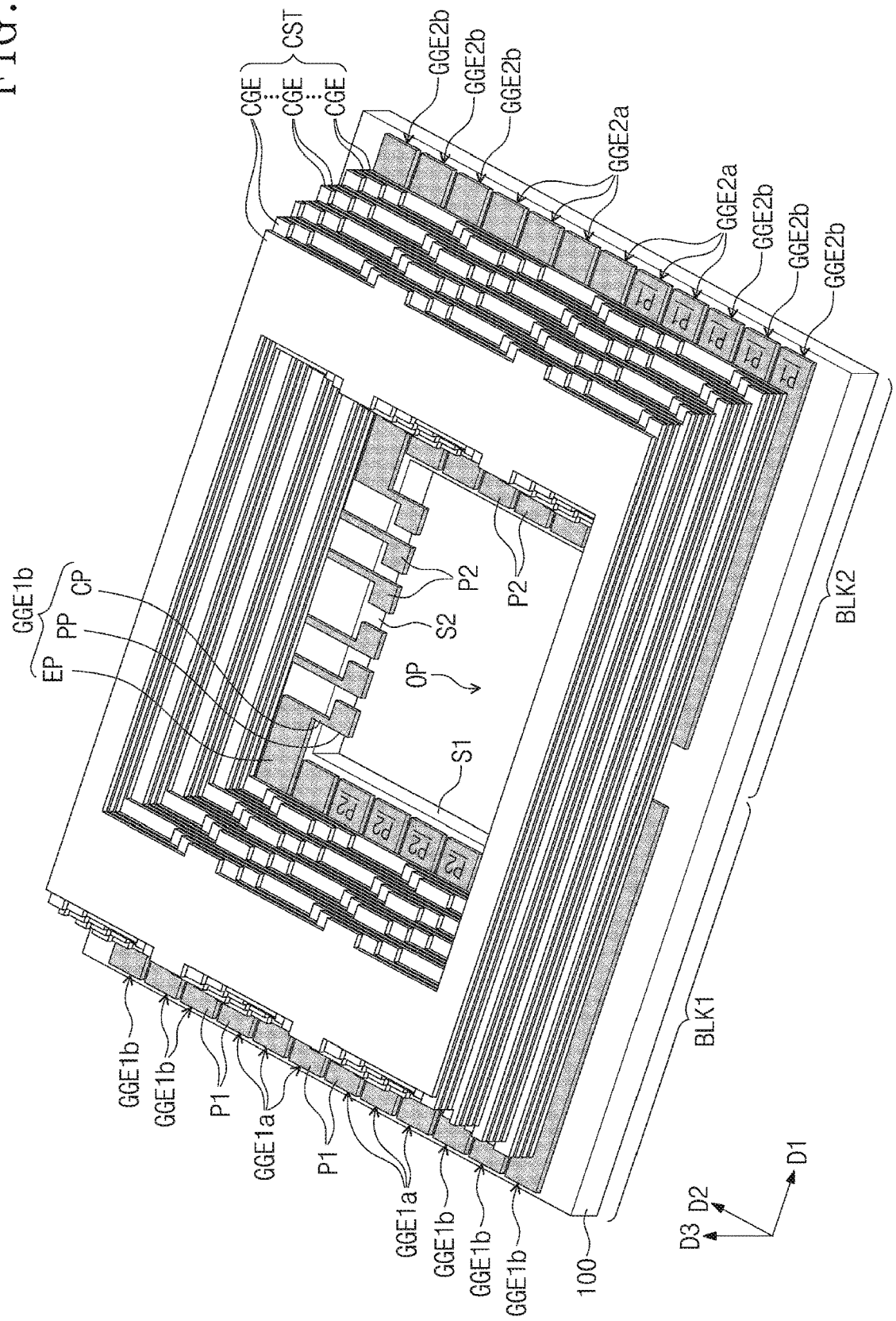
FIG. 15 is a perspective view illustrating an electrode structure of the 3D semiconductor memory device of FIG. 14.
Figure 16:
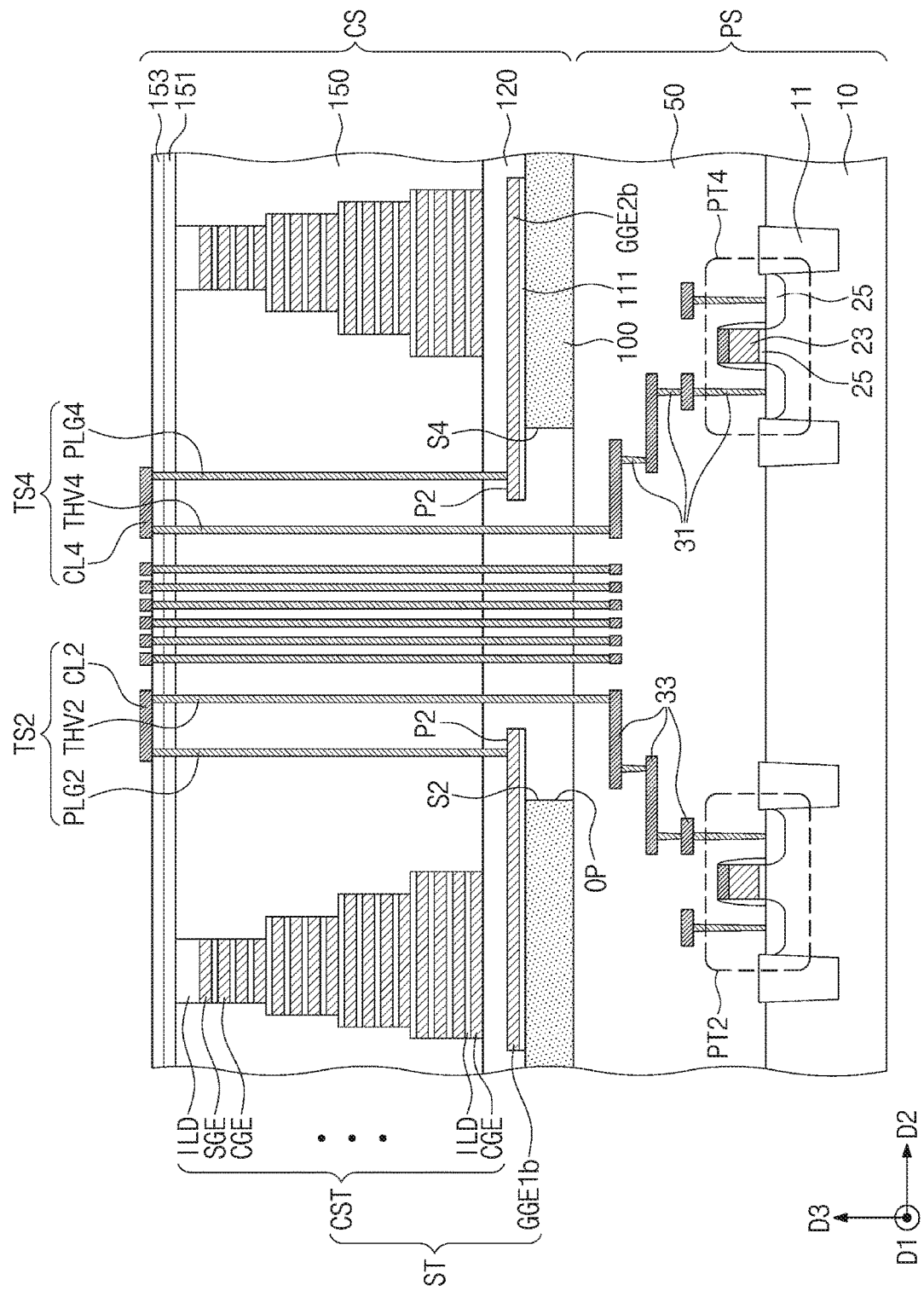
FIG. 16 is a cross-sectional view illustrating the 3D semiconductor memory device of FIG. 14.

FIG. 14 is a schematic plan view illustrating a 3D semiconductor memory device according to some embodiments of the inventive concepts. FIG. 15 is a perspective view illustrating an electrode structure of the 3D semiconductor memory device of FIG. 14. FIG. 16 is a cross-sectional view illustrating the 3D semiconductor memory device of FIG. 14.

For the purpose of ease and convenience in explanation, the descriptions to the same technical features as in the above embodiments will be omitted or mentioned briefly, and differences between the present embodiments and the above embodiments will be mainly described hereinafter.

Referring to FIGS. 14, 15 and 16, first and second ground selection gate electrodes GGE1a, GGE1b, GGE2a and GGE2b may be disposed between the horizontal semiconductor layer 100 and the cell electrode structure CST. Each of the first and second ground selection gate electrodes GGE1a, GGE1b, GGE2a and GGE2b may have a first pad P1 and a second pad P2. The first pads P1 of the first ground selection gate electrodes GGE1a and GGE1b may be disposed on the first connection region CNR1, and the second pads P2 of the first ground selection gate electrodes GGE1a and GGE1b may be disposed on the common connection region CNR3. The first pads P1 of the second ground selection gate electrodes GGE2a and GGE2b may be disposed on the second connection region CNR2, and the second pads P2 of the second ground selection gate electrodes GGE2a and GGE2b may be disposed on the common connection region CNR3.

The first ground selection gate electrodes GGE1a and GGE1b may include first gate electrodes GGE1a having the second pads P2 adjacent to the first sidewall S1 of the opening OP, and second gate electrodes GGE1b having the second pads P2 adjacent to the second sidewall S2 of the opening OP. Here, each of the second gate electrodes GGE1b may include an electrode portion EP extending in the first direction D1, a pad portion PP overlapping with the opening OP in a plan view, and a connection portion CP extending in the second direction D2 and connecting the electrode portion EP and the pad portion PP.

The second ground selection gate electrodes GGE2a and GGE2b may have substantially the same structures as the first ground selection gate electrodes GGE1a and GGE1b and may be mirror-symmetrical with the first ground selection gate electrodes GGE1a and GGE1b.

In addition, as described above, the through-interconnection structures TS1, TS2, TS3 and TS4 may be connected to the first and second pads P1 and P2 of the first and second ground selection gate electrodes GGE1a, GGE1b, GGE2a and GGE2b.

Figure 17:
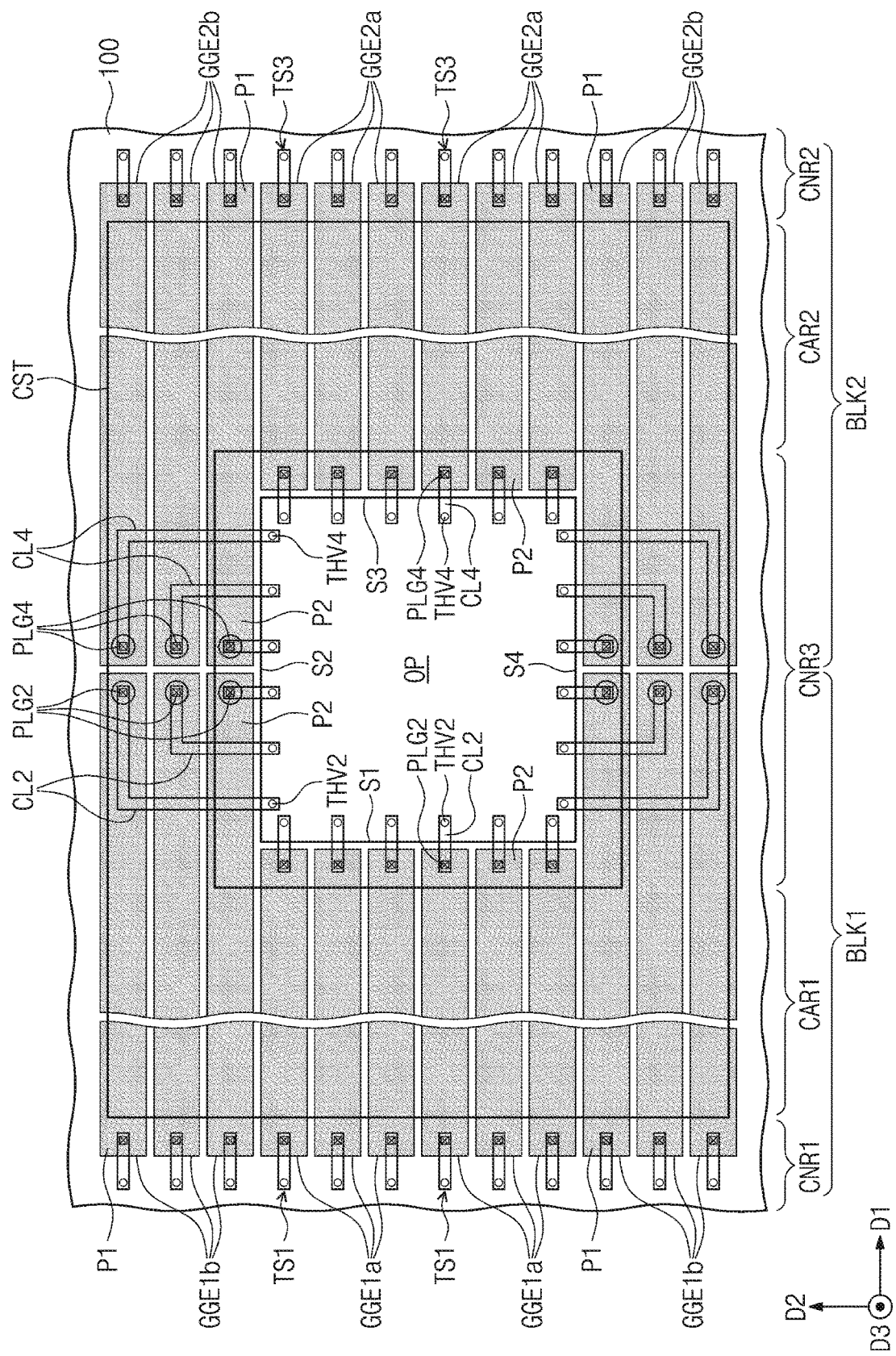
FIG. 17 is a schematic plan view illustrating a 3D semiconductor memory device according to some embodiments of the inventive concepts.
Figure 18:
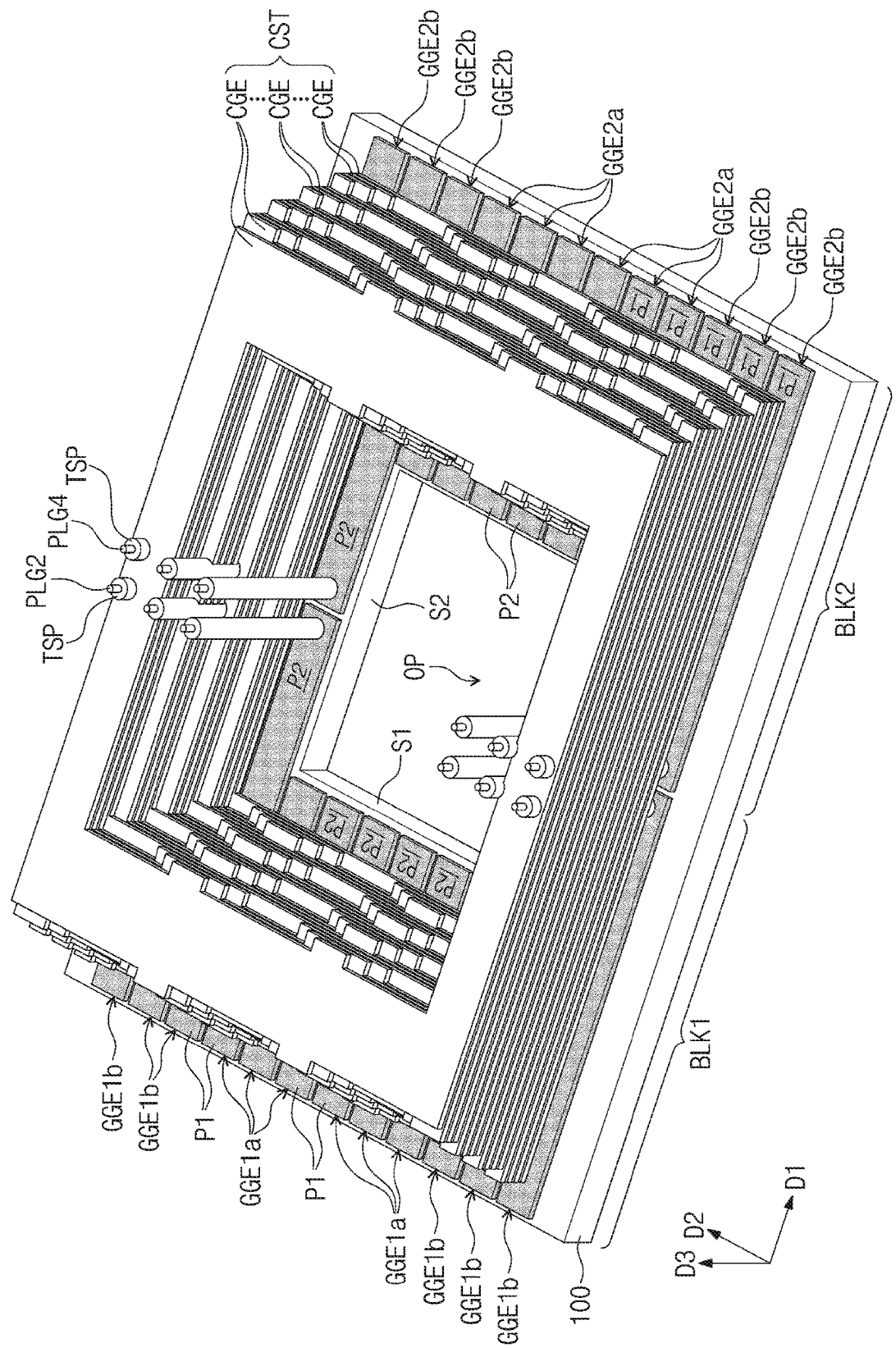
FIG. 18 is a perspective view illustrating an electrode structure of the 3D semiconductor memory device of FIG. 17.
Figure 19:
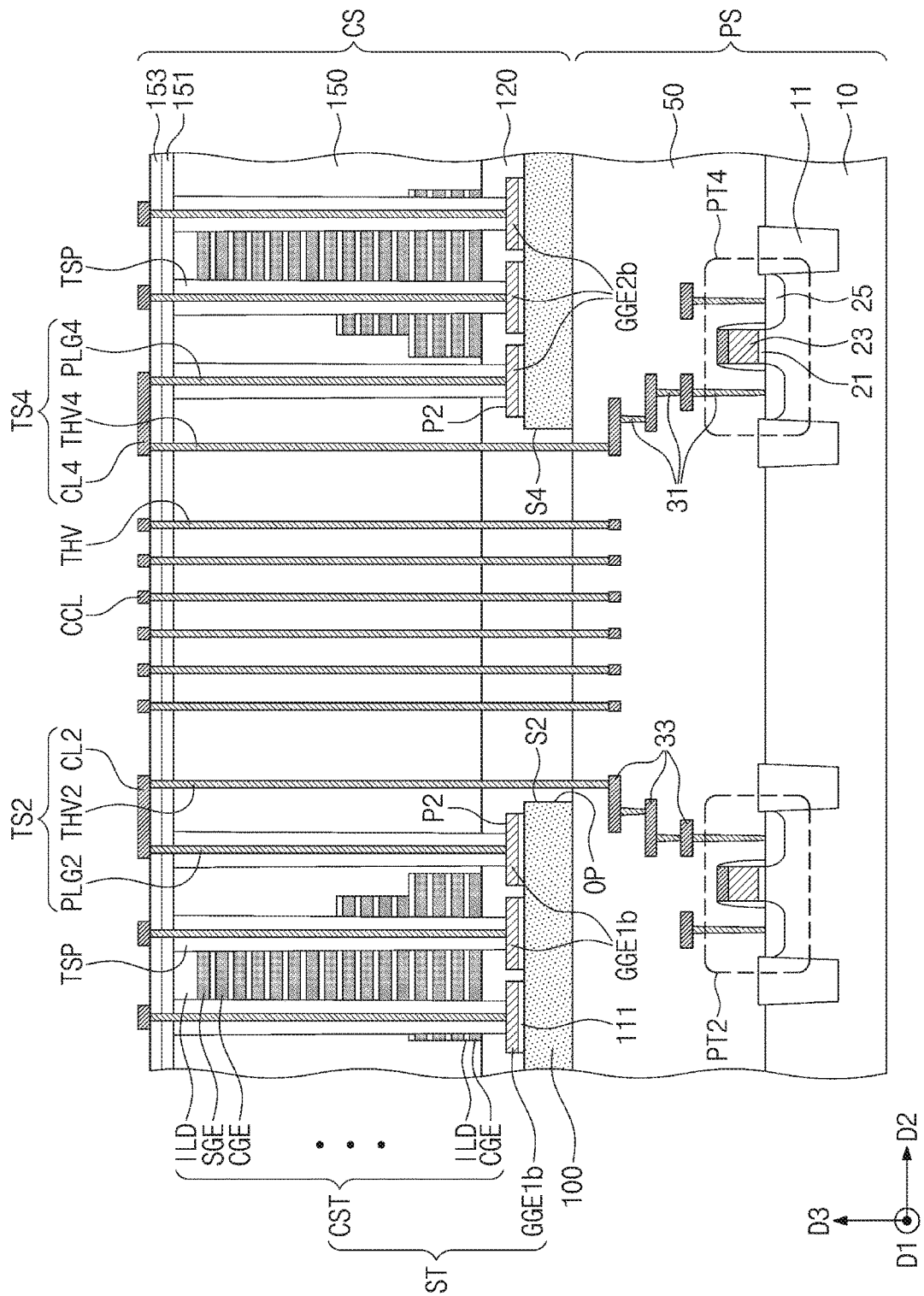
FIG. 19 is a cross-sectional view illustrating the 3D semiconductor memory device of FIG. 17.

FIG. 17 is a schematic plan view illustrating a 3D semiconductor memory device according to some embodiments of the inventive concepts. FIG. 18 is a perspective view illustrating an electrode structure of the 3D semiconductor memory device of FIG. 17. FIG. 19 is a cross-sectional view illustrating the 3D semiconductor memory device of FIG. 17. For the purpose of ease and convenience in explanation, the descriptions to the same technical features as in the above embodiments will be omitted or mentioned briefly, and differences between the present embodiments and the above embodiments will be mainly described hereinafter.

Referring to FIGS. 17, 18 and 19, first and second ground selection gate electrodes GGE1a, GGE1b, GGE2a and GGE2b may be disposed between the horizontal semiconductor layer 100 and the cell electrode structure CST. The first ground selection gate electrodes may include first and second gate electrodes GGE1a and GGE1b on the first cell array region CAR1, and the second ground selection gate electrodes may include third and fourth gate electrodes GGE2a and GGE2b on the second cell array region CAR2.

The first gate electrodes GGE1a and the second gate electrodes GGE1b may have substantially uniform widths in a plan view and may extend in the first direction D1. Lengths of the second gate electrodes GGE1b may be greater than lengths of the first gate electrodes GGE1a. Likewise, lengths of the fourth gate electrodes GGE2b may be greater than lengths of the third gate electrodes GGE2a.

First pads P1 of the first and second gate electrodes GGE1a and GGE1b may be disposed on the first connection region CNR1, and second pads P2 of the first and second gate electrodes GGE1a and GGE1b may be disposed on the common connection region CNR3. First pads P1 of the third and fourth gate electrodes GGE2a and GGE2b may be disposed on the second connection region CNR2, and second pads P2 of the third and fourth gate electrodes GGE2a and GGE2b may be disposed on the common connection region CNR3.

The second pads P2 of the first gate electrodes GGE1a may be disposed adjacent to the first sidewall S1 of the opening OP, and the second pads P2 of the third gate electrodes GGE2a may be disposed adjacent to the third sidewall S3 of the opening OP. In the present embodiments, at least some of the second pads P2 of the second and fourth gate electrodes GGE1b and GGE2b may overlap with the cell electrode structure CST when viewed in a plan view.

In some embodiments, the second through-interconnection structure TS2 may include second contact plugs PLG2 penetrating the cell electrode structure CST, through-insulating spacers TSP surrounding the second contact plugs PLG2, and second through-plugs THV2 disposed in the opening OP in a plan view. Here, the second contact plugs PLG2 may be connected to the second pads P2 of the second gate electrodes GGE1b of the first ground selection gate electrodes.

The fourth through-interconnection structure TS4 connected to the fourth gate electrodes GGE2b may include fourth contact plugs PLG4 penetrating the cell electrode structure CST, through-insulating spacers TSP surrounding the fourth contact plugs PLG4, and fourth through-plugs THV4 disposed in the opening OP in a plan view. Here, the fourth contact plugs PLG4 may be connected to the second pads P2 of the fourth gate electrodes GGE2b of the second ground selection gate electrodes.

According to the embodiments of the inventive concepts, the cell electrode structure may be provided in common in the first and second memory blocks, and the through-interconnection structure connecting the cell array structure and the peripheral logic structure may be provided in the common connection region between the first and second cell array regions. Here, the ground selection gate electrodes provided between the cell electrode structure and the horizontal semiconductor layer may be electrically isolated from each other. The through-interconnection structures may connect the first and second memory blocks to the peripheral circuits in substantially all directions when viewed in a plan view. Thus, the integration density of the 3D semiconductor memory device may be improved, and a degree of freedom of interconnection lines of the 3D semiconductor memory device may also be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   a horizontal semiconductor layer on a peripheral logic structure;
   a cell electrode structure comprising a plurality of cell gate electrodes vertically stacked on the horizontal semiconductor layer;
   a plurality of ground selection gate electrodes between the cell electrode structure and the horizontal semiconductor layer and horizontally spaced apart from each other, wherein each of the plurality of ground selection gate electrodes comprises a first pad and a second pad which are spaced apart from each other with the cell electrode structure therebetween when viewed in a plan view;
   a first through-interconnection structure connecting the first pads of the plurality of ground selection gate electrodes to the peripheral logic structure; and
   a second through-interconnection structure connecting the second pads of the plurality of ground selection gate electrodes to the peripheral logic structure.

2. The 3D semiconductor memory device of claim 1, wherein the cell electrode structure surrounds the first through-interconnection structure and extends in a first direction, when viewed in a plan view.

3. The 3D semiconductor memory device of claim 1, wherein the peripheral logic structure comprises:
   first pass transistors connected to the first pads of the plurality of ground selection gate electrodes through the first through-interconnection structures; and
   second pass transistors connected to the second pads of the plurality of ground selection gate electrodes through the second through-interconnection structures.

4. The 3D semiconductor memory device of claim 1, wherein the horizontal semiconductor layer includes a cell array region and a common connection region and has an opening having first and second sidewalls intersecting each other in the common connection region, and
   wherein the first through-interconnection structure is in the opening of the horizontal semiconductor layer when viewed in a plan view.

5. The 3D semiconductor memory device of claim 4, wherein the first pads of the plurality of ground selection gate electrodes are adjacent to the first and second sidewalls of the opening, and
   wherein the second pads of the plurality of ground selection gate electrodes are arranged in one direction.

6. The 3D semiconductor memory device of claim 4, wherein the plurality of ground selection gate electrodes comprise:
   first gate electrodes of which the first pads are adjacent to the first sidewall of the opening; and second gate electrodes of which the first pads are adjacent to the second sidewall of the opening.

7. The 3D semiconductor memory device of claim 6, wherein each of the first gate electrodes extends in a first direction parallel to a top surface of the horizontal semiconductor layer, and
wherein each of the second gate electrodes comprises: an electrode portion extending in the first direction; and an extension extending in a second direction intersecting the first direction.

8. The 3D semiconductor memory device of claim 4, wherein the first through-interconnection structure comprises:
contact plugs connected to the first pads of the plurality of ground selection gate electrodes;
through-plugs in the opening of the horizontal semiconductor layer in a plan view and connected to the peripheral logic structure; and
connection lines connecting the contact plugs to the through-plugs.

9. The 3D semiconductor memory device of claim 4, wherein the cell electrode structure has: first and second stepped structures facing each other in a first direction with the opening therebetween when viewed in a plan view; and third and fourth stepped structures facing each other in a second direction intersecting the first direction with the opening therebetween when viewed in a plan view, and
wherein the first to fourth stepped structures surround the first through-interconnection structure when viewed in a plan view.

10. The 3D semiconductor memory device of claim 1, wherein the horizontal semiconductor layer includes a first block region and a second block region,
wherein the cell electrode structure extends from the first block region to the second block region in a plan view,
wherein the plurality of ground selection gate electrodes comprise:
a plurality of first ground selection gate electrodes between the cell electrode structure and the first block region of the horizontal semiconductor layer; and
a plurality of second ground selection gate electrodes spaced apart from the first ground selection gate electrodes and between the cell electrode structure and the second block region of the horizontal semiconductor layer.

11. A three-dimensional (3D) semiconductor memory device comprising:
a horizontal semiconductor layer including a cell array region and a common connection region, the horizontal semiconductor layer including an opening having first and second sidewalls intersecting each other in the common connection region;
a cell electrode structure surrounding the opening when viewed in a plan view, the cell electrode structure comprising cell gate electrodes vertically stacked on the horizontal semiconductor layer; and
a plurality of ground selection gate electrodes between the cell electrode structure and the horizontal semiconductor layer and horizontally spaced apart from each other,
wherein the plurality of ground selection gate electrodes comprise:
first gate electrodes having first pads adjacent to the first sidewall of the opening; and
second gate electrodes having first pads adjacent to the second sidewall of the opening.

12. The 3D semiconductor memory device of claim 11, wherein each of the first gate electrodes extends in a first direction parallel to a top surface of the horizontal semiconductor layer, and
wherein each of the second gate electrodes comprises: an electrode portion extending in the first direction; and an extension extending in a second direction intersecting the first direction.

13. The 3D semiconductor memory device of claim 12, wherein the first gate electrodes have first lengths in a first direction, the second gate electrodes have second lengths in the first direction, and the second lengths are greater than the first lengths.

14. The 3D semiconductor memory device of claim 11, wherein the first pads of the first and second gate electrodes do not overlap with the cell electrode structure when viewed in a plan view.

15. The 3D semiconductor memory device of claim 11, wherein each of the first and second gate electrodes has a second pad spaced apart from the first pad with the cell electrode structure therebetween.

16. The 3D semiconductor memory device of claim 11, further comprising:
a peripheral logic structure under the horizontal semiconductor layer and comprising peripheral circuits integrated on a semiconductor substrate; and
through-interconnection structures connecting the peripheral logic structure and the plurality of ground selection gate electrodes.

17. The 3D semiconductor memory device of claim 16, wherein the through-interconnection structures comprise:
contact plugs connected to the first pads of the first and second gate electrodes;
through-plugs in the opening of the horizontal semiconductor layer in a plan view and connected to the peripheral circuits; and
connection lines connecting the contact plugs to the through-plugs.

18. The 3D semiconductor memory device of claim 11, wherein the cell array region includes a first cell array region and a second cell array region, which are spaced apart from each other with the common connection region therebetween, and
wherein the cell electrode structure extends from the first cell array region to the second cell array region when viewed in a plan view.

19. The 3D semiconductor memory device of claim 18, wherein the plurality of ground selection gate electrodes comprise:
a plurality of first ground selection gate electrodes on the first cell array region and comprising the first and second gate electrodes; and
a plurality of second ground selection gate electrodes on the second cell array region and comprising the first and second gate electrodes, the plurality of second ground selection gate electrodes spaced apart from the plurality of first ground selection gate electrodes,
wherein the plurality of first ground selection gate electrodes and the plurality of second ground selection gate electrodes are mirror-symmetrical when viewed in a plan view.

20. The 3D semiconductor memory device of claim 18, wherein the cell electrode structure has: first and second stepped structures facing each other in a first direction with the opening therebetween when viewed in a plan view; and third and fourth stepped structures facing each other in a second direction intersecting the first direction with the opening therebetween when viewed in a plan view.

* * * * *